USO11848305B2

(12) United States Patent
Jeng et al.

(10) Patent No.: US 11,848,305 B2
(45) Date of Patent: *Dec. 19, 2023

(54) SEMICONDUCTOR PACKAGES INCLUDING PASSIVE DEVICES AND METHODS OF FORMING SAME

(71) Applicant: Taiwan Semiconductor Manufacturing Co., Ltd., Hsinchu (TW)

(72) Inventors: Shin-Puu Jeng, Hsinchu (TW); Po-Yao Chuang, Hsinchu (TW); Shuo-Mao Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,448

(22) Filed: Mar. 7, 2022

(65) Prior Publication Data
US 2022/0189919 A1   Jun. 16, 2022

Related U.S. Application Data

(63) Continuation of application No. 16/934,861, filed on Jul. 21, 2020, now Pat. No. 11,270,975.

(51) Int. Cl.
| H01L 25/065 | (2023.01) |
| H01L 21/56 | (2006.01) |
| H01L 23/31 | (2006.01) |
| H01L 23/538 | (2006.01) |
| H01L 25/00 | (2006.01) |

(52) U.S. Cl.
CPC ........ H01L 25/0652 (2013.01); H01L 21/568 (2013.01); H01L 23/3128 (2013.01); H01L 23/3135 (2013.01); H01L 23/5383 (2013.01); H01L 23/5385 (2013.01); H01L 25/50 (2013.01)

(58) Field of Classification Search
CPC .............. H01L 25/0652; H01L 21/568; H01L 23/3128; H01L 23/3135; H01L 23/5383; H01L 23/5385; H01L 25/50
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |

(Continued)

*Primary Examiner* — Thanh Y. Tran
(74) *Attorney, Agent, or Firm* — Slater Matsil, LLP

(57) ABSTRACT

An embodiment is a structure including a first semiconductor device and a second semiconductor device, a first set of conductive connectors mechanically and electrically bonding the first semiconductor device and the second semiconductor device, a first underfill between the first and second semiconductor devices and surrounding the first set of conductive connectors, a first encapsulant on at least sidewalls of the first and second semiconductor devices and the first underfill, and a second set of conductive connectors electrically coupled to the first semiconductor device, the second set of conductive connectors being on an opposite side of the first semiconductor device as the first set of conductive connectors.

20 Claims, 29 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,270,975 B2 * | 3/2022 | Jeng .................. H01G 2/06 |
| 2012/0284541 A1 | 11/2012 | Dennard et al. |
| 2013/0241078 A1 | 9/2013 | Lee et al. |
| 2018/0254260 A1 | 9/2018 | Wei et al. |
| 2019/0259726 A1 * | 8/2019 | Jeng .................. H01L 23/3135 |
| 2020/0043893 A1 | 2/2020 | Chen et al. |
| 2020/0161267 A1 | 5/2020 | Jeng et al. |
| 2020/0279831 A1 | 9/2020 | Chen et al. |
| 2021/0005592 A1 | 1/2021 | Lee et al. |

\* cited by examiner

SEMICONDUCTOR PACKAGES INCLUDING PASSIVE DEVICES AND METHODS OF FORMING SAME

PRIORITY CLAIM AND CROSS-REFERENCE

This application is a continuation of U.S. patent application Ser. No. 16/934,861, entitled "Semiconductor Packages including Passive Devices and Methods of Forming Same," filed on Jul. 21, 2020, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
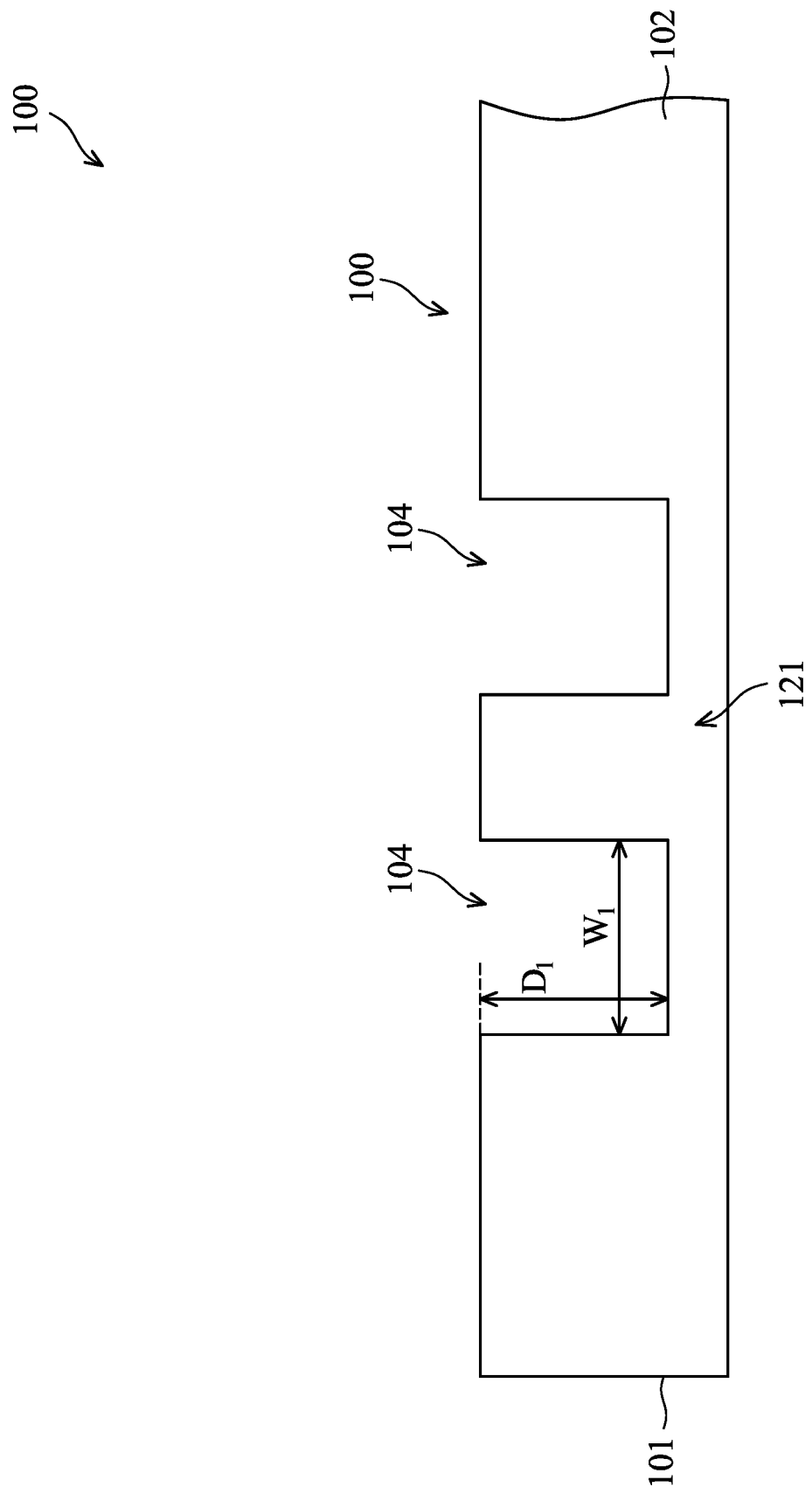
FIGS. 1-6 illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., an integrated fan-out (InFO) package structure or a chip-on-wafer-on-substrate (CoWoS) package structure) having one or more semiconductor devices vertically stacked and connected to effectively form a larger semiconductor device. In some embodiments, the semiconductor device may be an integrated passive devices (IPD) comprising capacitors, such as deep trench capacitors (DTCs), metal-oxide-metal (MOM) capacitors, metal-insulator-metal (MIM) capacitors, the like, or a combination thereof. By having vertically stacked IPDs, a high-efficiency capacitor—that may be used as a decoupling capacitor—can be formed. Also, the package structure including the one or more capacitors that are vertically stacked and coupled can provide a lower equivalent series resistance (ESR) of the capacitors.

Further, the teachings of this disclosure are applicable to any IPD package structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1-5 illustrate cross-sectional views of various intermediate stages of fabrication of a semiconductor device 100 in accordance with some embodiments. FIG. 1 illustrates a cross-sectional view of an edge portion of the semiconductor device 100, with a sidewall 101 being the edge of the semiconductor device 100. In some embodiments, the semiconductor device 100 comprises a substrate 102. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GalnAs, GaInP, and/or GaInAsP; or combinations thereof. Other substrates, such as multi-layered or gradient substrates, may also be used.

In some embodiments, one or more recesses 104 (illustrated by two recesses 104 in FIG. 1) are formed in the substrate 102. In some embodiments, the substrate 102 may be patterned using suitable photolithography and etching methods to form the recesses 104. For example, a photoresist (not shown) may be formed and patterned over the substrate 102, and one or more etching processes (e.g., a dry etch process) may be utilized to remove those portions of the substrate 102 where the recesses 104 are desired. In some embodiments, the recesses 104 may have a width $W_1$ between about 20 nm and about 2000 nm. In some embodiments, the recesses 104 may have a depth $D_1$ between about 500 nm and about 10000 nm. In some embodiments, a ratio $W_1/D_1$ is between about 0.002 and about 4. As described below in greater detail deep trench capacitors (DTCs) are formed in the recesses 104.

Figure 2:
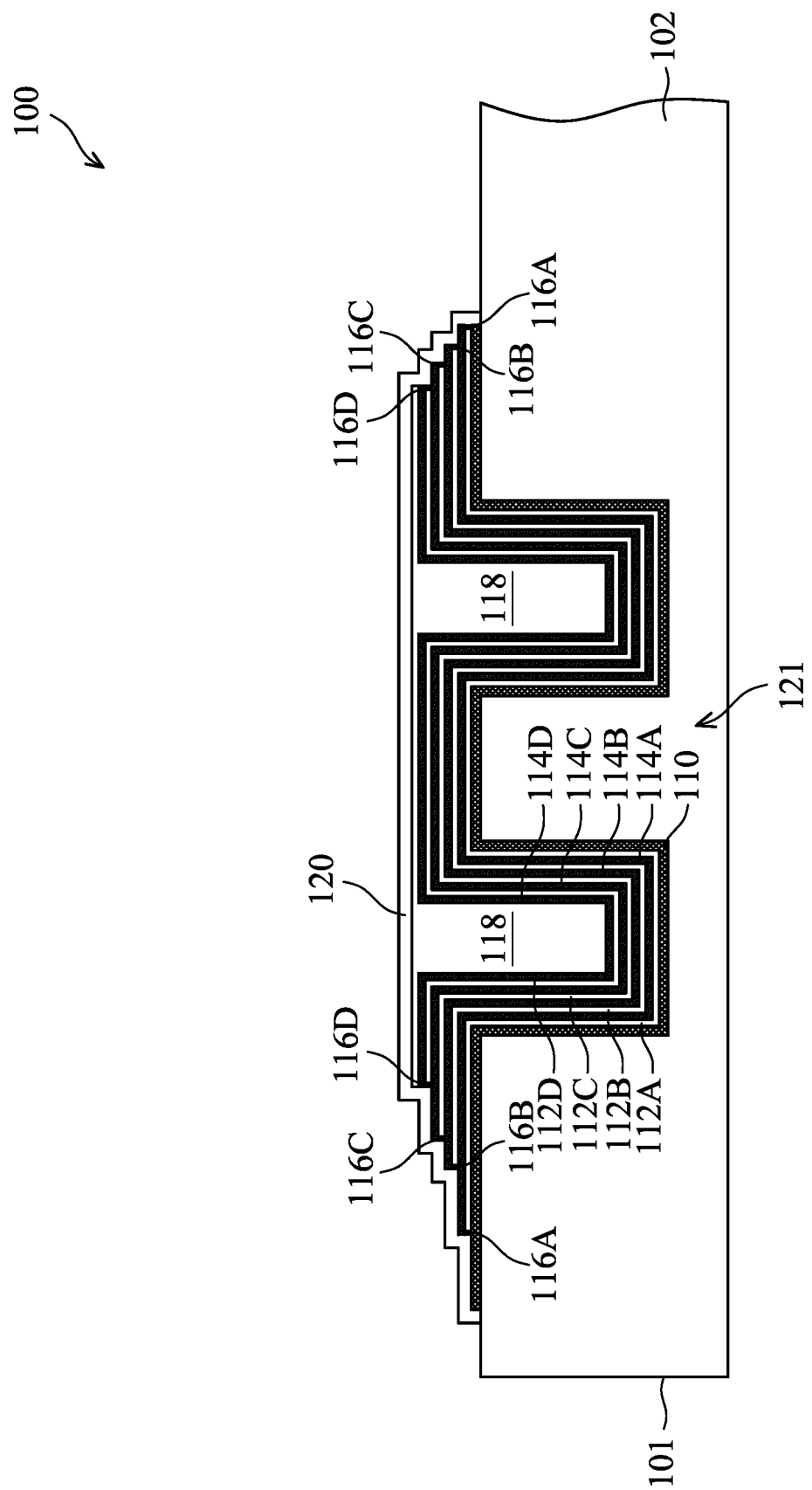

Referring to FIG. 2, deep trench capacitors (DTCs) are formed in the recesses 104 (see FIG. 1). In some embodiments, a liner layer 110 is formed over the substrate 102 and along sidewalls and bottoms of the recesses 104. In some embodiments, the liner layer 110 may comprise a dielectric material, such as silicon oxide, silicon oxynitride (SiON), silicon carboxynitride (SiCON), a combination thereof, or the like, and may be formed using atomic layer deposition (ALD), chemical vapor deposition (CVD), a combination thereof, or the like. In some embodiments, the liner layer 110 has a thickness between about 5 nm and about 100 nm. In some embodiments, the liner layer 110 is patterned to expose a top surface of the substrate 102. In some embodiments, the patterning processes may comprise suitable photolithography and etching methods.

In some embodiments, after forming the liner layer 110, conductive layers 112A-112D and dielectric layers 114A-114D are formed in the recesses 104 (see FIG. 1) in an alternating manner. The conductive layers 112A-112D may be also referred to as capacitor electrodes 112A-112D. In some embodiments, each of the conductive layers 112A-112D may comprise a conductive material such as doped silicon, polysilicon, copper, tungsten, an aluminum or copper alloy, titanium, titanium nitride, tantalum, tantalum nitride, a combination thereof, or the like, and may be formed using plating, physical vapor deposition (PVD), ALD, CVD, a combination thereof, or the like. In some embodiments, each of the conductive layers 112A-112D has a thickness between about 10 nm and about 100 nm. In some embodiments, each of the dielectric layers 114A-114D may comprise a high-K dielectric material such as aluminum oxide, zirconium oxide, a combination thereof, a multilayer thereof, or the like. In an embodiment, each of the dielectric layers 114A-114D comprises a multilayer including two layers of zirconium oxide and a layer of aluminum oxide interposed between the layers of zirconium oxide. In some embodiments, each of the dielectric layers 114A-114D has a thickness between about 0.3 nm and about 50 nm.

In some embodiments, after forming the conductive layer 112A over the liner layer 110, the conductive layer 112A is patterned to expose portions of a top surface of the liner layer 110. In some embodiments, the patterning processes may comprise suitable photolithography and etching methods. Subsequently, spacers 116A are formed along opposite sidewalls of the conductive layer 112A. Each of the spacers 116A may comprise a dielectric material such as silicon oxide, silicon nitride, silicon oxynitride, a combination thereof, a multilayer thereof, or the like. In some embodiments, the spacers 116A are formed by blanket depositing a dielectric material using ALD, CVD, a combination thereof, or the like, and anisotropically etching the dielectric material to remove horizontal portions of the dielectric material. Remaining vertical portions of the dielectric material form the spacers 116A. In some embodiments, each of the spacers 116A has a width between about 5 nm and about 50 nm. Subsequently, the dielectric layer 114A is former over the conductive layer 112A and the spacers 116A. In some embodiments, the dielectric layer 114A is patterned to remove portions of the dielectric layer 114A extending beyond the spacers 116A. In some embodiments, the patterning processes may comprise suitable photolithography and etching methods.

Next, the conductive layer 112B is blanket formed over the dielectric layer 114A and the substrate 102. The conductive layer 112B is then patterned to expose portions of a top surface of dielectric layer 114A. In some embodiments, the patterning processes may comprise suitable photolithography and etching methods. Subsequently, spacers 116B are formed along opposite sidewalls of the conductive layer 112B. In some embodiments, the spacers 116B may be formed using similar materials and methods as the spacers 116A and the description is not repeated herein. In some embodiments, each of the spacers 116B has a width between about 5 nm and about 50 nm. Subsequently, the dielectric layer 114B is former over the conductive layer 112B and the spacers 116B. In some embodiments, the dielectric layer 114B is patterned to remove portions of the dielectric layer 114B extending beyond the spacers 116B. In some embodiments, the patterning processes may comprise suitable photolithography and etching methods.

Next, the process steps described above with reference to forming the conductive layer 112B, the spacers 116B and the dielectric layer 114B are repeated to form the conductive layer 112C, the spacers 116C and the dielectric layer 114C over the dielectric layer 114B and to form the conductive layer 112D, the spacers 116D and the dielectric layer 114C. In some embodiments, the spacers 116C and 116D may be formed using similar materials and methods as the spacers 116A and the description is not repeated herein. In some embodiments, each of the spacers 116C has a width between about 5 nm and about 50 nm. In some embodiments, each of the spacers 116D has a width between about 5 nm and about 50 nm. In the embodiment illustrated in FIG. 2, the DTC 121 has four capacitor electrodes. Further, in the embodiment illustrated in FIG. 2, the DTC 121 is formed in two separate recesses 104 in the substrate 102. In other embodiments, the DTC 121 may have more or less than four capacitor electrodes based on design requirements for the DTC 121 and/or may only be formed in a single recess 104. As one of ordinary skill in the art will recognize, the above described process for forming DTCs is merely one method of forming the DTCs, and other methods are also fully intended to be included within the scope of the embodiments.

Referring further to FIG. 2, after forming the DTC 121 in the substrate 102, remaining portions of the recesses 104 (see FIG. 1) are filled with a dielectric material 118. In some embodiments, the dielectric material 118 may comprise an oxide such as silicon oxide, a nitride such as a silicon nitride, a combination thereof, a multilayer thereof, or the like. In some embodiments, the dielectric material 118 is patterned to remove portions of the dielectric material 118 extending beyond the spacers 116D. In some embodiments, the patterning processes may comprise suitable photolithography and etching methods.

In some embodiments, after forming and patterning the dielectric material 118, an etch stop layer 120 is formed over the DTC 121. In some embodiments, the etch stop layer 120 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, plasma-enhanced CVD (PECVD), ALD, a combination thereof, or the like. In some embodiments, the etch stop layer 120 has a thickness between about 3 nm and about 30 nm. In some embodiments, the etch stop layer 120 is used to aid in forming conductive vias that provide electrical connection to the conductive layers 112A-112D of the DTC 121. The etch stop layer 120 may be also referred to as a contact etch stop layer (CESL).

Figure 3:
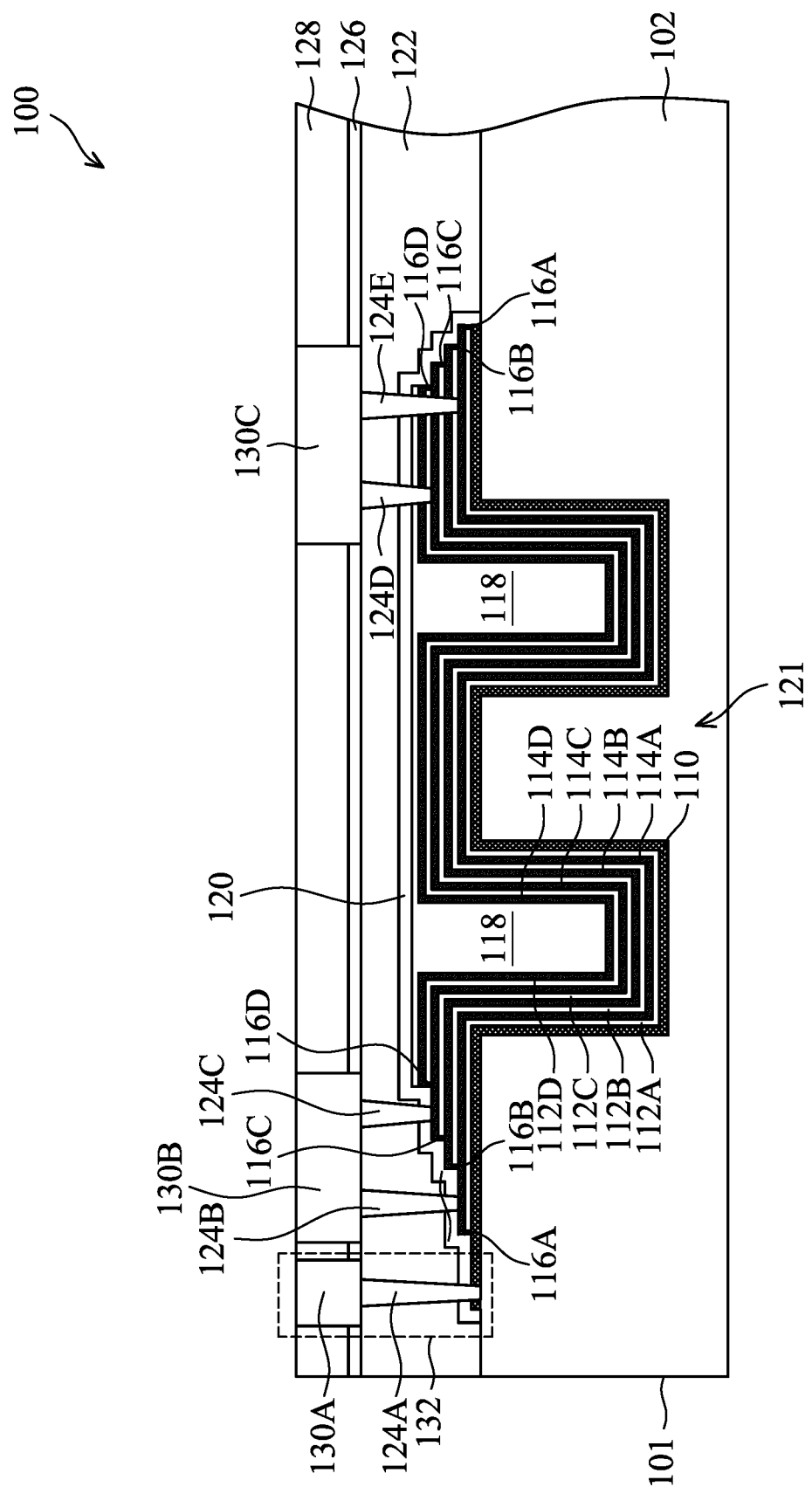
Figure 4:
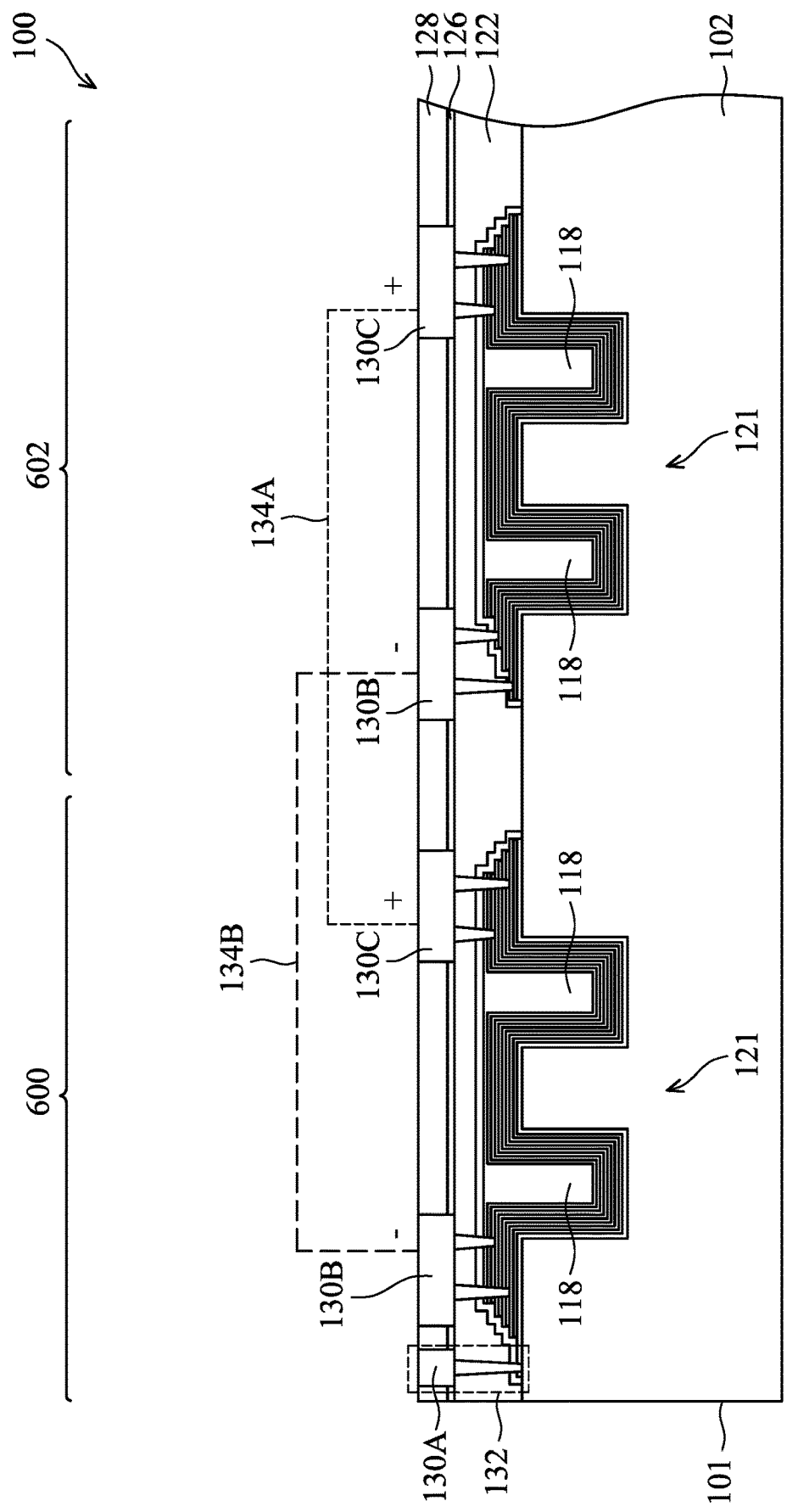
Figure 5:
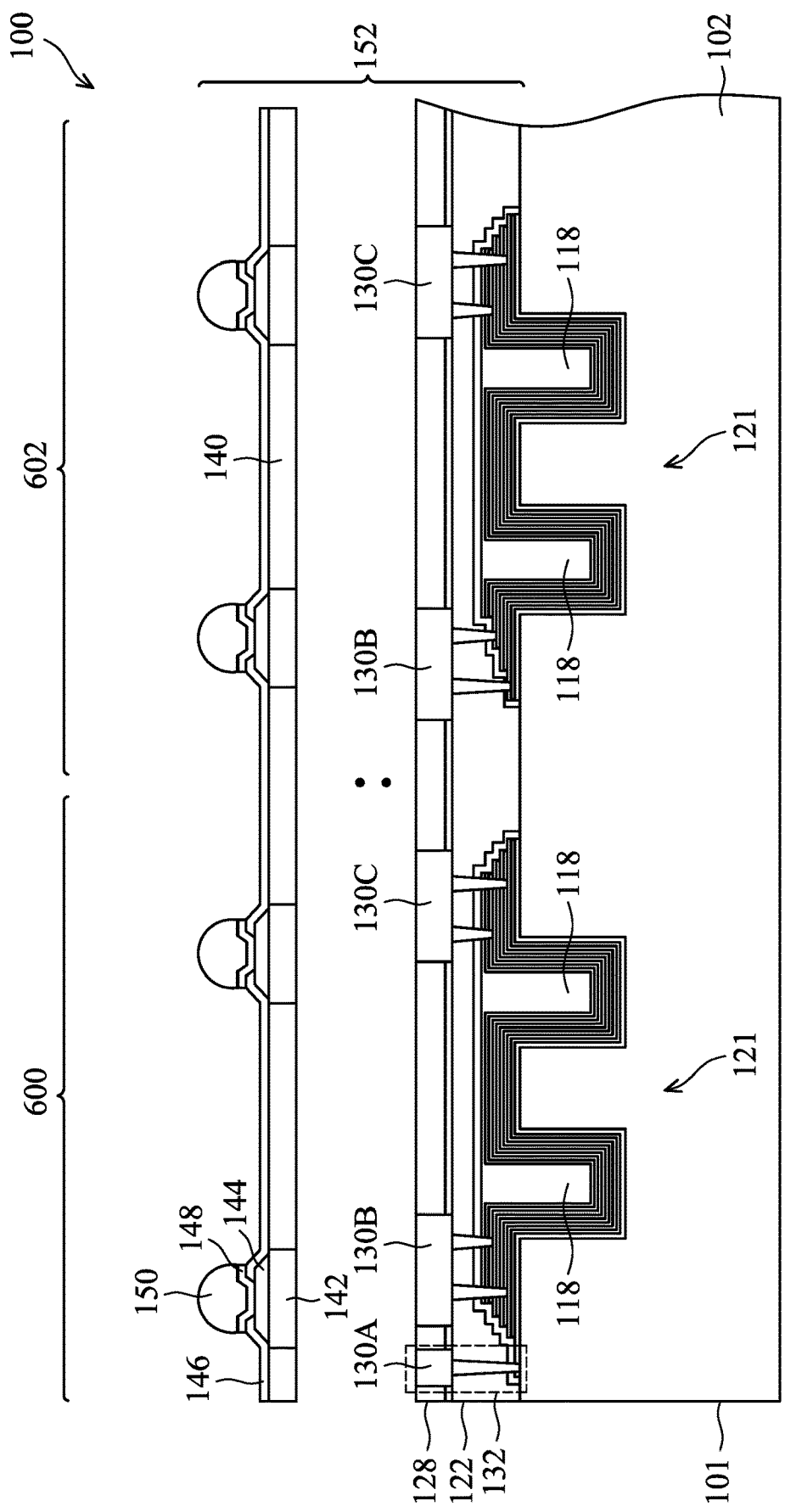

Referring to FIGS. 3 through 5, after forming the DTC 121, an interconnect structure 152 is formed over the substrate 102 and the DTC 121. In some embodiments, the interconnect structure 152 comprises a plurality of dielectric layers with conductive features embedded in the plurality of dielectric layers. In the embodiment illustrated in FIG. 3, the interconnect structure 152 comprises a dielectric layer 122 with conductive vias 124A-124E embedded within the dielectric layer 122 and a dielectric layer 128 with conductive lines 130A-130C embedded within the dielectric layer 128.

In some embodiments, the dielectric layers 122 and 128 may include a low-k dielectric material such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, and may be formed by any suitable method, such as spin-on coating, CVD, PECVD, ALD, a combination thereof, or the like. The conductive features (such as conductive vias 124A-124E and conductive lines 130A-130C may be formed using any suitable method, such as a damascene method, or the like. In some embodiments, the steps for forming the conductive features include forming openings in the respective dielectric layers, depositing one or more barrier/adhesion layers (not shown) in the openings, depositing seed layers (not shown) over the one or more barrier/adhesion layers, and filling the openings with a conductive material. A chemical mechanical polishing (CMP) is then performed to remove excess materials of the one or more barrier/adhesion layers, the seed layers, and the conductive material overfilling the openings.

In some embodiments, the one or more barrier/adhesion layers may comprise titanium, titanium nitride, tantalum, tantalum nitride, a combination thereof, or the like, and may be formed using PVD, CVD, ALD, a combination thereof, or the like. The seed layers may comprise copper, titanium, nickel, gold, manganese, a combination thereof, or the like, and may be formed by plating, ALD, CVD, PVD, sputtering, a combination thereof, or the like. The conductive material may comprise copper, aluminum, tungsten, combinations thereof, alloys thereof, or the like, and may be formed using, for example, by plating, or other suitable methods.

In some embodiments, the interconnect structure 152 further comprises an etch stop layer 126 formed between the dielectric layers 122 and 128. A material for the etch stop layer 126 is chosen such that etch rates of the etch stop layer 126 are less then etch rates of corresponding ones of the dielectric layers 122 and 128. In some embodiments, an etch rate of the etch stop layer 126 is less than an etch rate of the dielectric layer 128. In some embodiments, an etch rate of the etch stop layer 126 is less than an etch rate of the dielectric layer 122. In some embodiments, the etch stop layer 126 may comprise similar material as the etch stop layer 120 described above with reference to FIG. 2 and the description is not repeated herein.

In some embodiments, the conductive via 124A extends through the dielectric layer 122, the etch stop layer 120, and the liner layer 110 and physically contacts the substrate 102. The conductive via 124A electrically couples the substrate 102 to the conductive line 130A. The conductive via 124B extends through the dielectric layer 122, the etch stop layer 120, and the dielectric layer 114A and physically contacts the conductive layer 112A. The conductive via 124B electrically couples the conductive layer 112A to the conductive line 130B. The conductive via 124C extends through the dielectric layer 122, the etch stop layer 120, and the dielectric layer 114C and physically contacts the conductive layer 112C. The conductive via 124C electrically couples the conductive layer 112C to the conductive line 130B. The conductive via 124D extends through the dielectric layer 122, the etch stop layer 120, the dielectric material 118, and the dielectric layer 114D and physically contacts the conductive layer 112D. The conductive via 124D electrically couples the conductive layer 112D to the conductive line 130C. The conductive via 124E extends through the dielectric layer 122, the etch stop layer 120, the dielectric material 118, the dielectric layers 114B-114D, the conductive layers 112C and 112D and physically contacts the conductive layer 112B. The conductive via 124E electrically couples the conductive layer 112B to the conductive line 130C. In the embodiment illustrated in FIG. 3, the conductive vias 124A-124E partially extend into respective ones of the conductive layers 112A-112D. In other embodiments, one or more of the conductive vias 124A-124E may fully extend though respective ones of conductive layers 112A-112D.

In some embodiments, the conductive line 130B can represent the bottom electrode (e.g., capacitor electrode at a lower potential) of the DTC 121 and the conductive line 130C can represent the top electrode (e.g., capacitor electrode at a higher potential) of the DTC 121. Although, in some embodiments, these orientations can be reversed.

Referring further to FIG. 3, in some embodiments some of the conductive features of the interconnect structure 152 near the edge 101 of the semiconductor device 100 form a seal ring structure 132. In the embodiment illustrated in FIG. 3, the seal ring structure 132 comprises the conductive via 124A and the conductive line 130A. In some embodiments, the seal ring structure 132 extends along the edge 101 of the semiconductor device 100 and encircles an interior portion of the semiconductor device 100 in a plan view.

FIG. 4 illustrates an embodiment with multiple DTCs 121 in the substrate 102 and illustrates an exemplary electrical connection between the DTCs 121. In FIG. 4, there is a DTC 121 in a first region 600 and another DTC 121 in a second region 602. Each of the DTCs 121 are formed as described above and may be formed simultaneously.

In some embodiments, the two adjacent DTCs 121 are electrically coupled such that the conductive lines 130B (e.g., bottom electrodes) of the DTCs 121 are coupled together by line 134B and the conductive lines 130C (e.g., top electrodes) of the DTCs 121 are coupled together by line 134A. Thus, in this configuration, the DTCs 121 are coupled in parallel and can provide a larger effective capacitance as needed for design requirements. In some embodiments, the lines 134A and 134B can be implemented by forming more dielectric layers with more embedded conductive features in the interconnect structure 152 illustrated in FIGS. 3 and 4.

FIG. 5 illustrates further processing on the structure of FIGS. 3 and 4 to complete the interconnect structure 152. In FIG. 5, one or more dielectric layers with more embedded conductive features is formed over the dielectric layer 128 and conductive lines 130A-130C to connect the conductive lines 130A-130C to the desired configuration. In FIG. 5, a dielectric layer 440 is formed over these one or more dielectric layers and has conductive lines 142 embedded therein. The conductive lines 142 may be electrically coupled to the underlying conductive features to achieve the desired electrical configuration. These overlying dielectric layers and conductive features may be similar to the dielectric layers 122, 126, and 128 and conductive lines 130A-130C described above and the description is not repeated herein.

Further in FIG. 5, contact pads 144 are formed over the interconnect structure 152. The contact pads 144 are in electrical contact with one or more respective conductive lines 142. In some embodiments, the contact pads 144 may comprise a conductive material such as aluminum, copper, tungsten, silver, gold, a combination thereof, or the like. In some embodiments, a conductive material may be formed over the interconnect structure 152 using, for example, PVD, ALD, electro-chemical plating, electroless plating, a combination thereof, or the like. Subsequently, the conductive material is patterned to form the contact pads 144. In some embodiments, the conductive material may be patterned using suitable photolithography and etching methods.

Further in FIG. 5, a passivation layer 146 is formed over the interconnect structure 152 and the contact pads 144. In some embodiments, the passivation layer 146 may comprise one or more layers of non-photo-patternable insulating materials, one or more layers of photo-patternable insulating materials, a combination thereof, or the like. The non-photo-patternable insulating materials may comprise silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. The photo-patternable insulating materials may comprise polybenzoxazole (PBO), polyimide (PI), benzocyclobutene (BCB), a combination thereof, or the like, and may be formed using a spin-on coating process, or the like. In some embodiments, the passivation layer 146 has a thickness between about 5 nm and about 50 nm.

In some embodiments, openings are formed in the passivation layer 146 to expose portions of the contact pads 144, respectively. In some embodiments, the passivation layer 146 may be patterned using suitable photolithography and etching method. In some embodiments, the openings have a width between about 500 nm and about 5000 nm.

Further in FIG. 5, the formation of underbump metallizations (UBMs) 148 over the contact pads 144 is illustrated. In some embodiments, each of the UBMs 148 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 148. Any suitable materials or layers of material that may be used for the UBMs 148 are fully intended to be included within the scope of the current application.

The formation of the UBMs 148 may include a mask layer (not shown) formed over the passivation layer 146. In some embodiments, the mask layer comprises a photoresist, or the like and is patterned to form openings in the mask layer. In some embodiments where the mask layer comprises a photoresist, the patterning process may include suitable photolithography methods. The openings expose the openings in the passivation layer 146.

After forming the openings in mask layer, a conductive layer is formed over the mask layer and sidewalls and bottoms of combined openings in the mask layer and the passivation layer 146. In some embodiments, the conductive layer comprises titanium, copper, nickel, chrome, gold, tungsten, allows thereof, multilayers thereof, or the like, and may be formed using PVD, ALD, CVD, electro-chemical plating, electroless plating, a combination thereof, or the like. In some embodiments, the conductive layer has a thickness between about 5 nm and about 100 nm.

After forming the conductive layer, the mask layer and portions of the conductive layer formed thereon are removed. The remaining portions of the conductive layer form the UBMs 148 over the contact pads 144. In some embodiments where the mask layer comprises a photoresist, the removal process may include an ashing process followed by a wet clean process.

Further in FIG. 5, conductive connectors 150 are formed over and electrically coupled to the UBMs 148. In some embodiments, each of the connectors 150 may be a solder ball, a controlled collapse chip connection (C4) bump, a ball grid array (BGA) ball, a micro bump, an electroless nickel-electroless palladium-immersion gold technique (ENEPIG) formed bump, a copper pillar, a combination thereof, or the like. In some embodiments where the connectors 150 are formed of solder materials, a reflow process may be performed in order to shape the solder material into the desired bump shapes. In some embodiments, after forming the connectors 150, the semiconductor device 100 is diced to form individual semiconductor devices. The dicing process may include sawing, a laser ablation method, an etching process, a combination thereof, or the like. Subsequently, each of the individual semiconductor devices may be tested to identify known good dies (KGDs) for further processing.

Figure 6:
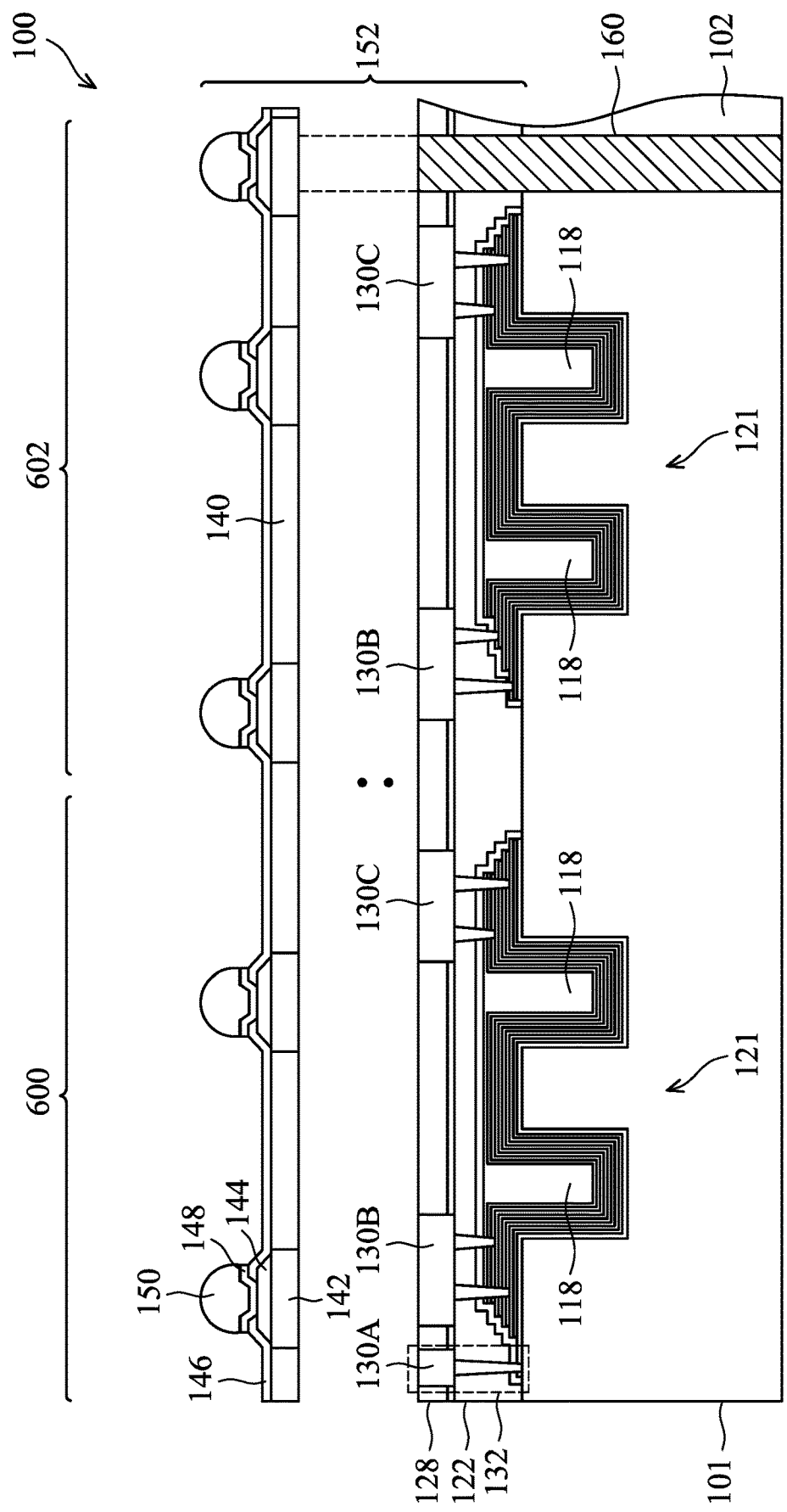

FIG. 6 illustrates a cross-sectional view of a semiconductor device 100 accordance with some embodiments. This embodiment is similar to the embodiment illustrated in FIGS. 1 through 5 except that this embodiment includes a through via 160. Details regarding this embodiment that are similar to those for the previously described embodiment will not be repeated herein.

In this embodiment, the through via 160 is formed through the substrate 102 and/or the interconnect structure 152 to provide the ability to electrically couple this semiconductor device 100 to adjacent devices (e.g., devices above and below this semiconductor device 100). In some embodiments, the through via 160 is only formed through the substrate 102 and is coupled to the interconnect structure 152 and can utilize the conductive features of the interconnect structure and the connectors 150 to be coupled to other devices. In some embodiments, the through via 160 is formed through the substrate 102 and the interconnect structure 152 and can utilize the connectors 150 to be coupled to other devices. The through via 160 can be formed by patterning a hole in the substrate 102 and/or the interconnect structure and forming a conductive material in the hole. The conductive material may be formed by a similar process as described above for conductive features in the interconnect structure 152 and the description is not repeated herein.

Although FIGS. 1 through 6 illustrate the formation of a semiconductor device 100 with deep trench capacitors, the disclosure is not so limited. In some embodiments, the semiconductor device 100 is formed to include other types of capacitors such as metal-oxide-metal (MOM) capacitors, metal-insulator-metal (MIM) capacitors, the like, or a combination thereof.

Figure 7:
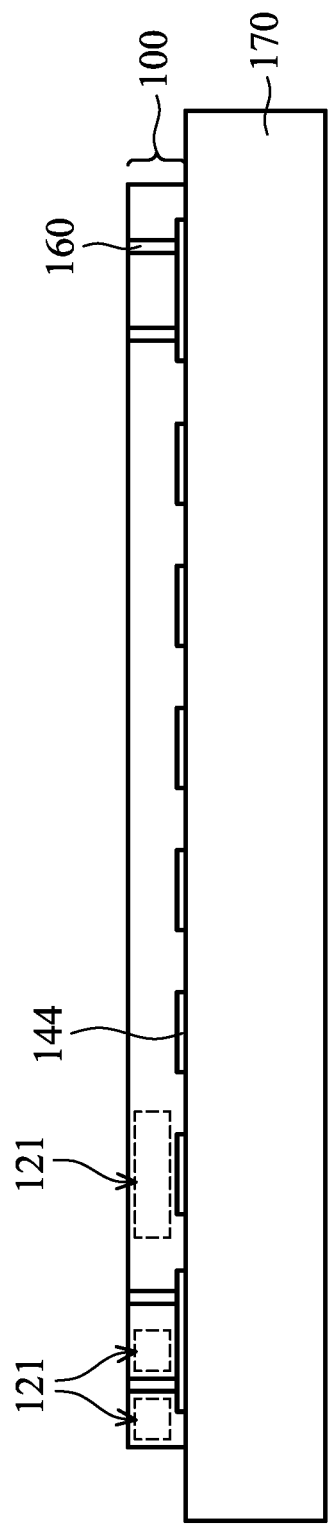
FIGS. 7-16 illustrate cross-sectional views of various intermediate stages of fabrication of a semiconductor package in accordance with some embodiments.

FIGS. 7-15 illustrate cross-sectional views of various intermediate stages of fabrication of a semiconductor package 200 in accordance with some embodiments. The semiconductor package 200 will incorporate one or more of the semiconductor devices 100. FIG. 7 illustrates a carrier substrate 170 and a semiconductor device 100 bonded to the carrier substrate 170.

The semiconductor devices 100 in this embodiment include the DTCs 121 in each of the semiconductor devices 100. As illustrated in FIG. 7, the semiconductor device 100 bonded to the carrier substrate 170 has the through vias 160 extending through the semiconductor device 100. Further, the through vias 160 and conductive connectors 150 (see, e.g., FIGS. 8 and 9) are used to couple the DTCs 121 of the different semiconductor devices 100 in parallel and provide a larger effective capacitance for the semiconductor package 200 than is possible with a single semiconductor device 100.

The carrier substrate 170 may be a glass carrier substrate, a ceramic carrier substrate, or the like. The carrier substrate 170 may be a wafer, such that multiple semiconductor devices 100 can be bonded to different regions of the carrier substrate 170 simultaneously. In some embodiments, the semiconductor device 100 is bonded to the carrier substrate 170 with the use of an adhesive layer (not shown), such as a release layer. The release layer may be formed of a polymer-based material, which may be removed along with the carrier substrate 170 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 170, or may be the like. The top surface of the release layer may be leveled and may have a high degree of coplanarity.

Figure 8:
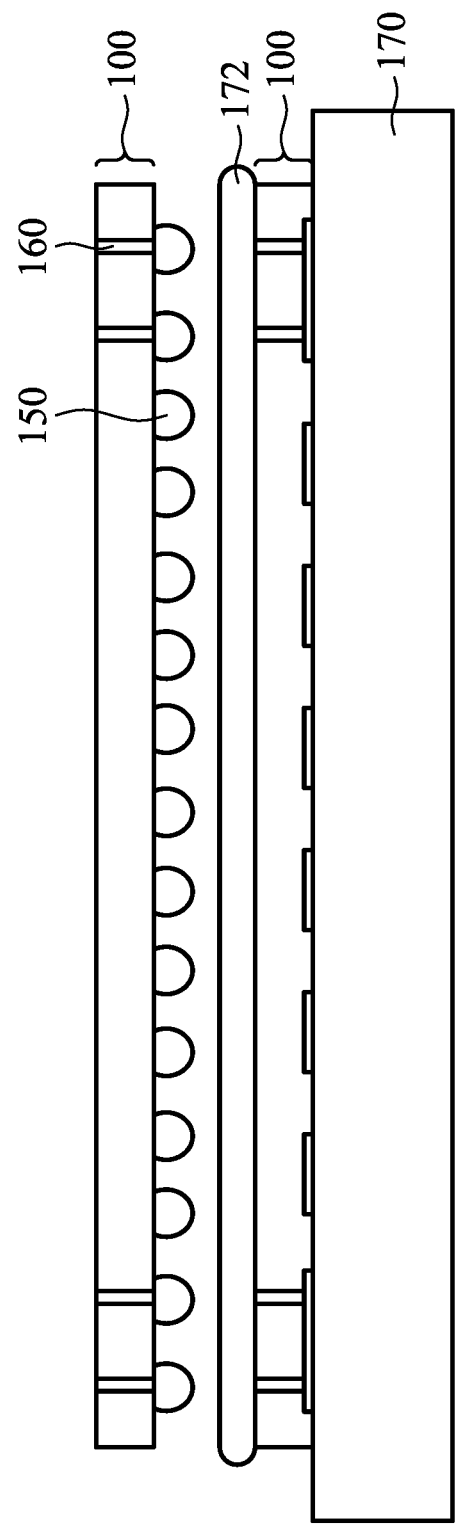

In FIG. 8, an underfill 172 is formed over the bonded semiconductor device 100 and another semiconductor device 100 is bonded to the already bonded semiconductor device 100. The underfill 172 is formed over the already bonded semiconductor device 100. The underfill 172 may be formed of a liquid epoxy, a deformable gel, a silicon rubber, a non-conductive film, a polymer, PBO, polyimide, solder resist, or a combination thereof. The underfill 172 provides structural support for the subsequently bonded conductive connectors 150 and may be deposited over the semiconductor device 100. In some embodiments, the underfill 172 is formed to leave openings over the semiconductor device 100.

FIG. 8 further illustrates another semiconductor device 100 being bonded to a top side of the already bonded semiconductor device 100. The semiconductor device 100 may be placed over the bonded semiconductor device 100 using, for example, a pick-and-place tool.

After the semiconductor device 100 is placed over the bonded semiconductor device 100, the semiconductor device 100 is mechanically and electrically bonded to the underlying semiconductor device 100 by way of conductive connectors 150, through vias 160, and contact pads 144.

In some embodiments, before bonding the conductive connectors 150, the conductive connectors 150 are coated with a flux (not shown), such as a no-clean flux. The conductive connectors 150 may be dipped in the flux or the flux may be jetted onto the conductive connectors 150. In another embodiment, the flux may be applied to the surfaces of the through vias 160 and the contact pads 144.

In some embodiments, the conductive connectors 150 may have an optional epoxy flux (not shown) formed thereon before they are reflowed with at least some of the epoxy portion of the epoxy flux remaining after the semiconductor device 100 is attached to the underlying semiconductor device 100.

The bonding between the semiconductor devices 100 may be a solder bonding. In an embodiment, the semiconductor devices 100 are bonded to each other by a reflow process. During this reflow process, the conductive connectors 150 are in contact with the through vias 160 and/or contact pads 144 to physically and electrically couple the semiconductor devices 100. After the bonding process, an intermetallic compound (IMC, not shown) may form at the interface of the through vias 160 and the conductive connectors 150 and also at the interface between the conductive connectors 150 and the contact pads 144 (not shown).

Figure 9:
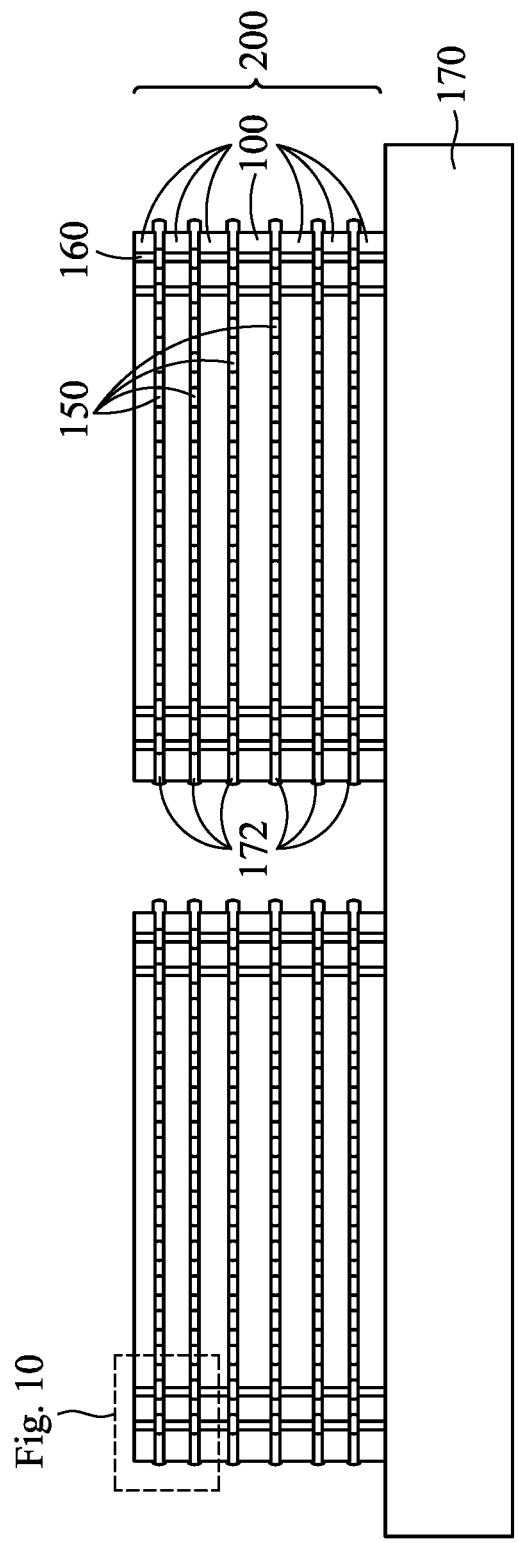

In FIG. 9, the process illustrated and described in FIG. 8 is repeated until the desired number of semiconductor devices 100 are bonded together in a semiconductor package 200. Further, FIG. 9 illustrates two semiconductor packages 200 being formed adjacent to each other on the same carrier substrate 170. In the embodiment illustrated in FIG. 9, the semiconductor packages 200 includes seven stacked semiconductor devices 100. In other embodiments, the semiconductor packages 200 may have more or less than seven semiconductor devices 100 based on design requirements for the semiconductor package. In a specific embodiment, each of the semiconductor devices 100 can have an effective capacitance of about 10 to about 100 microFarads (µF), such that the semiconductor packages 200 having seven stacked semiconductor devices 100 can have an effective capacitance of about 50 to about 10000 µF.

In some embodiments, the through vias 160 of the stacked semiconductor devices 100 may be substantially aligned such that the stack of through vias 160 are electrically and mechanically coupled together by way of the conductive connectors 150 and, if present, contact pads 144 and UBMs 148. In this embodiment, one or more of the stacked through vias 160 may be the terminal for the top electrode of the effective capacitor formed by the semiconductor package 200 and another one or more of the stacked through vias 160 may be the terminal for the bottom electrode of the effective capacitor formed by the semiconductor package 200.

Figure 10:
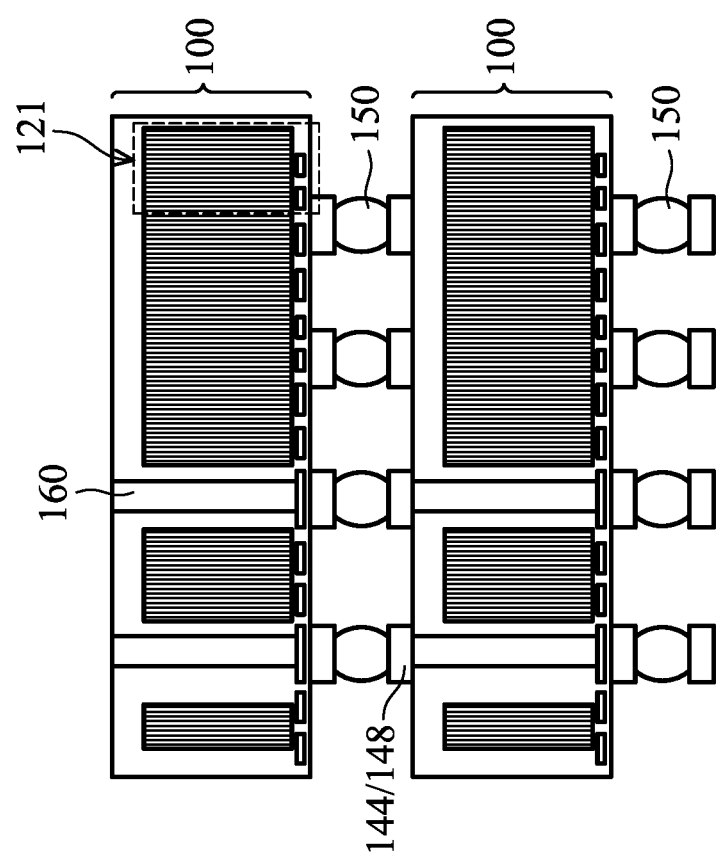

FIG. 10 illustrates a detailed-view of an exemplary bonding between a pair of adjacent stacked semiconductor devices 100. Please note that the underfill 172 is not illustrated. As illustrated in FIG. 10, the conductive connector 150 may be coupled to UBMs 148 and/or contact pads 144 of the semiconductor devices to form the semiconductor package 200 that includes two or more semiconductor devices 100 that are stacked and electrically and mechanically coupled together.

Figure 11:
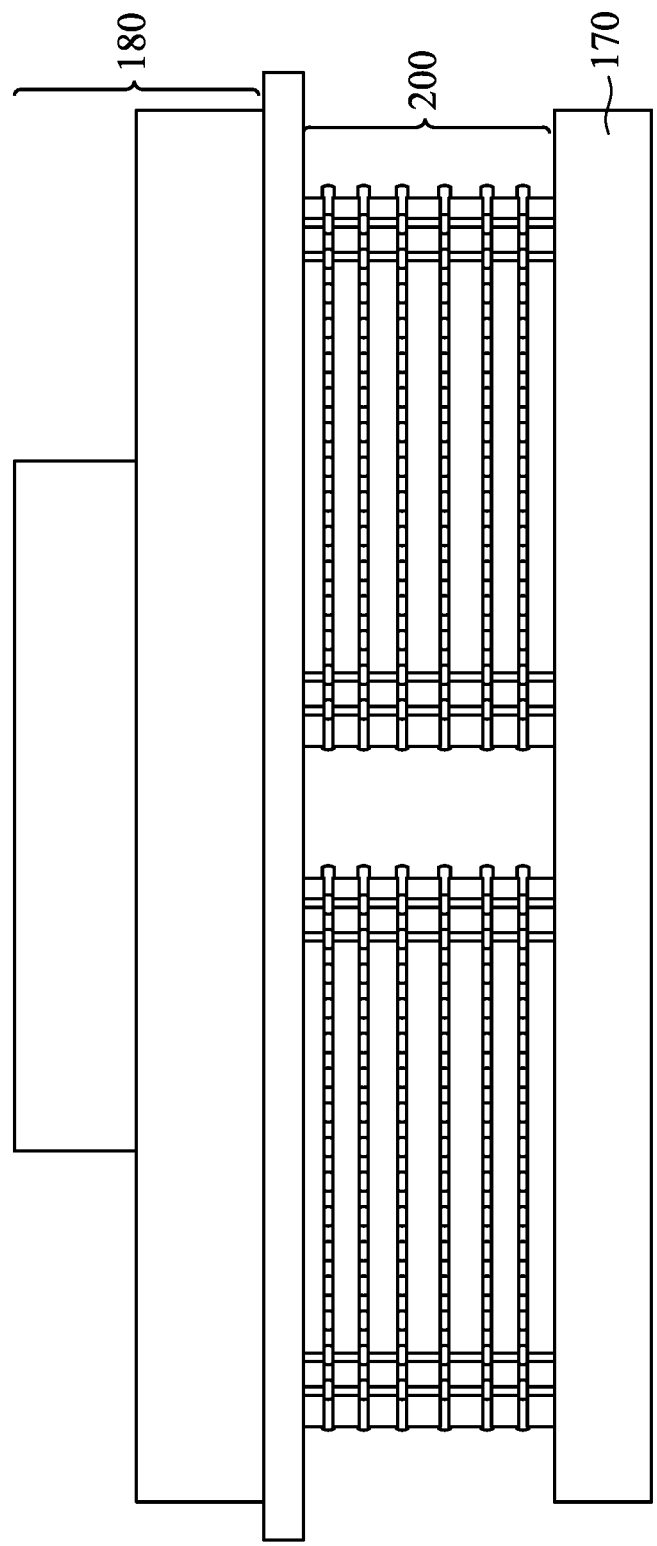

While each layer of the semiconductor devices 100 may be bonded to the underlying semiconductor device 100 individually after the layer is placed, in some embodiments, all of the layers of the semiconductor devices 100 can be placed without bonding and the semiconductor devices 100 are bonded in a single bonding process at the end. FIG. 11 illustrates the process of bonding all of the semiconductor devices 100 of the respective semiconductor packages 200 in a single process at the end using a bond head 180. The bond head 180 can apply heat and or pressure to bond the conductive connectors 150 to the UBMs 148 and/or contact pads 144. In some embodiments, the through vias 160 can transmit the heat and/or pressure from the bond head 180 to each of the layers of the conductive connectors 150, UBMs 148, and/or contact pads 144 to facilitate the mechanical and electrical bonding of the semiconductor devices 100.

Figure 12:
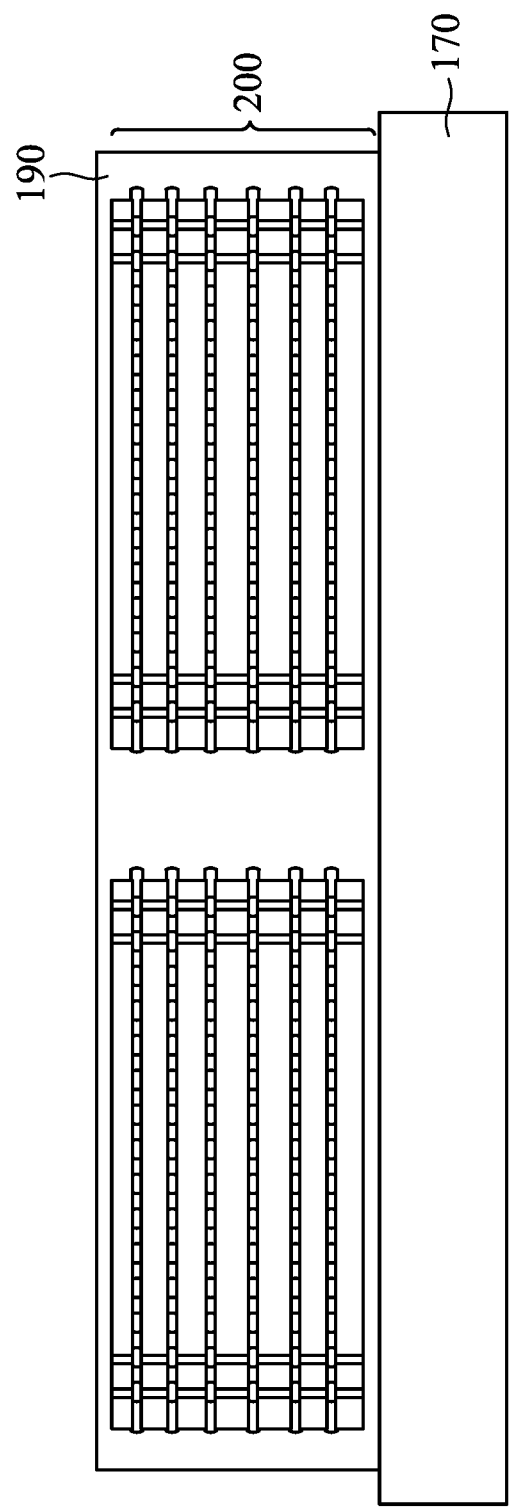

In FIG. 12, after the bond head 180 is removed, an encapsulant 190 is formed on the semiconductor packages 200 and the carrier substrate 170. The encapsulant 190 may be a molding compound, epoxy, or the like, and may be applied by compression molding, transfer molding, or the like. The encapsulant 190 may be formed over the carrier substrate 170 such that the through vias 160 and/or contact pads 144 of the semiconductor devices 100 are buried or covered. The encapsulant 190 is then cured.

In some embodiments, a planarization process is performed on the encapsulant 190. The planarization process may be, for example, a chemical-mechanical polish (CMP), a grinding process, or the like.

Figure 13:
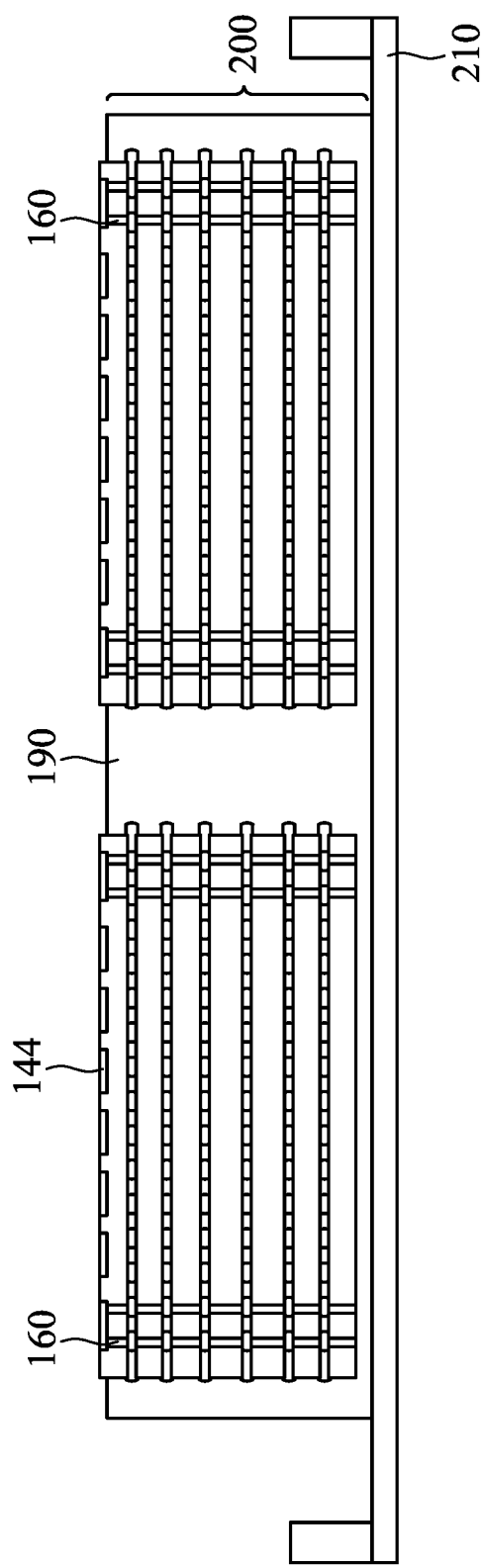

In FIG. 13, a carrier substrate de-bonding is performed to detach (de-bond) the carrier substrate 170 from the semiconductor packages 200. In accordance with some embodiments, the de-bonding includes projecting a light such as a laser light or an UV light on the release layer (if present) so that the release layer decomposes under the heat of the light and the carrier substrate 170 can be removed. The structure is then flipped over and placed on a tape 210.

Further in FIG. 13, a planarization process may be performed on the flipped structure to expose the through vias 160 and/or the contact pads 144. The planarization process may also grind the encapsulant 190. Top surfaces of the through vias 160, contact pads 144, and encapsulant 190 are coplanar after the planarization process. The planarization process may be, for example, a CMP, a grinding process, or the like. In some embodiments, the planarization may be omitted, for example, if the through vias 160 and contact pads 144 are already exposed.

A singulation process is performed by sawing along scribe line regions 218, e.g., between the separate stacks of the semiconductor devices 100. The resulting, singulated semiconductor packages 200 are from the separate stacks of the semiconductor devices 100 on the tape 210.

Figure 14:
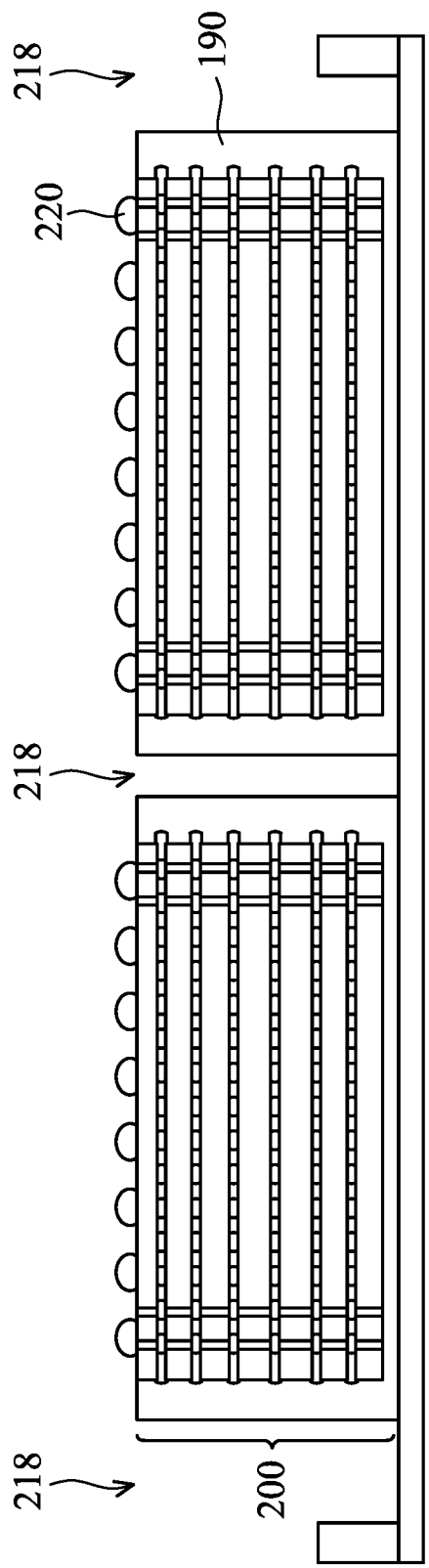

Further in FIG. 14, conductive connectors 220 are formed over and electrically coupled to the through vias 160 and the contact pads 144 and/or UBMs 148. The conductive connectors 220 allow for the semiconductor package 200 to be mechanically and electrically coupled to another package structure. The conductive connectors 220 may be similar to the conductive connectors 150 described above and the description is not repeated herein.

Figure 15:
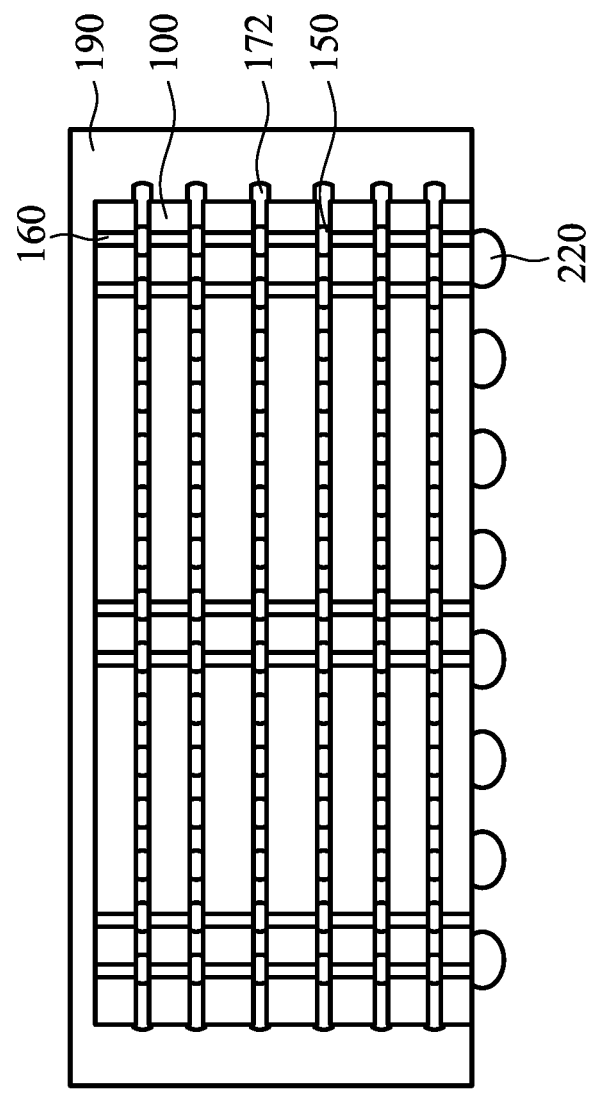
Figure 16:
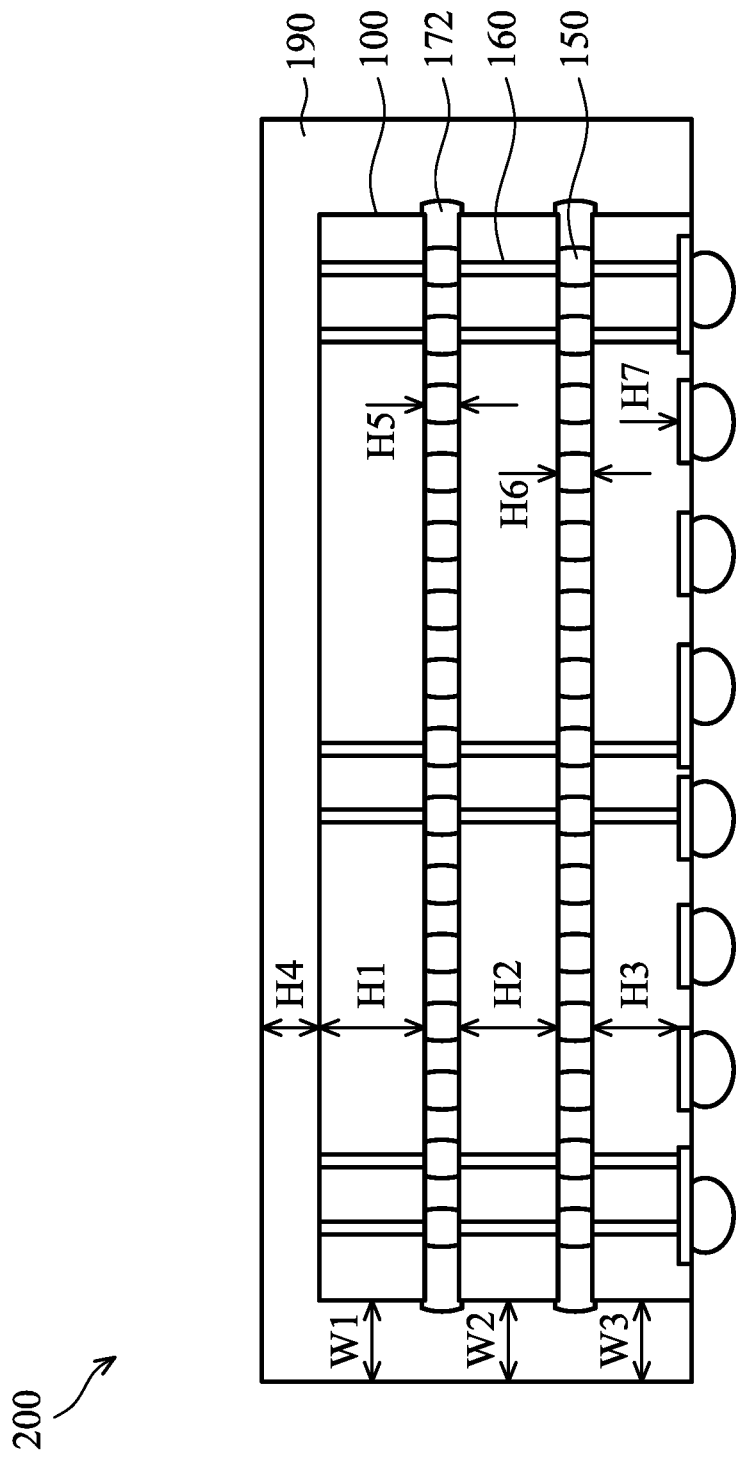

FIG. 15 illustrates a semiconductor package 200 after it has been removed from the tape 210. FIG. 16 illustrates dimensions of the semiconductor package 200. In FIG. 16, a thickness of the individual semiconductor devices 100 from a frontside to a backside of the semiconductor devices 100 is shown by H1, H2, and H3, with H1 being the thickness of the top semiconductor device 100, H2 being the thickness of the middle semiconductor device 100, and H3 being the thickness of the bottom semiconductor device 100. In some embodiments, H3 is greater than H2 and H1. In some embodiments, all of the thicknesses H1, H2, and H3 are equal.

In FIG. 16, a thickness of the encapsulant over the top semiconductor device 100 is shown by H4. In some embodiments, H1, H2, and H3 are each greater than or equal to H4. In FIG. 16, a height of the conductive connectors 150 is shown by H5 and H6, and a height of the conductive connectors 220 is shown by H7. In some embodiments, H7 is greater than or equal to H5 and H6.

In FIG. 16, a width of the encapsulant from the sidewall of the individual semiconductor devices 100 to the sidewall of the encapsulant 190 is shown by W1, W2, and W3, with W1 being the width of the encapsulant from the sidewall of the top semiconductor device 100 to the sidewall of the encapsulant, with W2 being the width of the encapsulant from the sidewall of the middle semiconductor device 100 to the sidewall of the encapsulant, with W3 being the width of the encapsulant from the sidewall of the bottom semiconductor device 100 to the sidewall of the encapsulant. In some embodiments, W3 is greater than W2 and W1. In some embodiments, all of the thicknesses W1, W2, and W3 are equal.

FIGS. 17 through 20 illustrate cross-sectional views of intermediate steps during a process for a semiconductor package 300, in accordance with some embodiments. The embodiment in FIGS. 17 through 20 is similar to the embodiments illustrated in FIGS. 1 through 16 except that this embodiment the semiconductor package 300 includes a redistribution structure 350. Details regarding this embodiment that are similar to those for the previously described embodiment will not be repeated herein.

Figure 17:
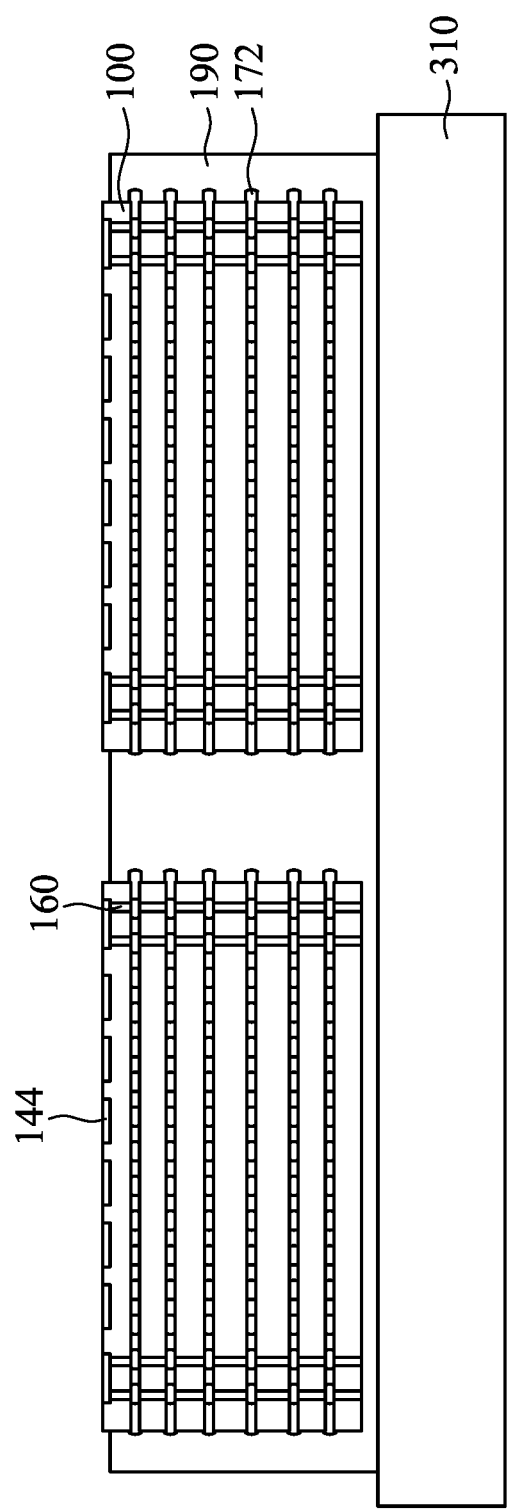
FIGS. 17-20 illustrate cross-sectional views of various intermediate stages of fabrication of a semiconductor package in accordance with some embodiments.

FIG. 17 illustrates an intermediate stage of processing similar to that described in FIG. 13 above and the description of forming this intermediate stage of processing is not repeated herein. In FIG. 17, as opposed to the embodiment of FIG. 13, after the carrier substrate 170 is de-bonded, the encapsulated stacks of semiconductor devices 100 are bonded flipped over and bonded to a second carrier substrate 310 as opposed to a tape.

The carrier substrate 310 may be a glass carrier substrate, a ceramic carrier substrate, or the like. The carrier substrate 310 may be a wafer, such that multiple semiconductor devices 100 can be bonded to different regions of the carrier substrate 310 simultaneously. In some embodiments, the semiconductor device 100 is bonded to the carrier substrate 310 with the use of an adhesive layer (not shown), such as a release layer. The release layer may be formed of a polymer-based material, which may be removed along with the carrier substrate 310 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 310, or may be the like. The top surface of the release layer may be leveled and may have a high degree of planarity.

Further in FIG. 17, a planarization process may be performed on the flipped structure to expose the through vias 160 and/or the contact pads 144. The planarization process may also grind the encapsulant 190. Top surfaces of the through vias 160, contact pads 144, and encapsulant 190 are coplanar after the planarization process. The planarization process may be, for example, a CMP, a grinding process, or the like. In some embodiments, the planarization may be omitted, for example, if the through vias 160 and contact pads 144 are already exposed.

Figure 18:
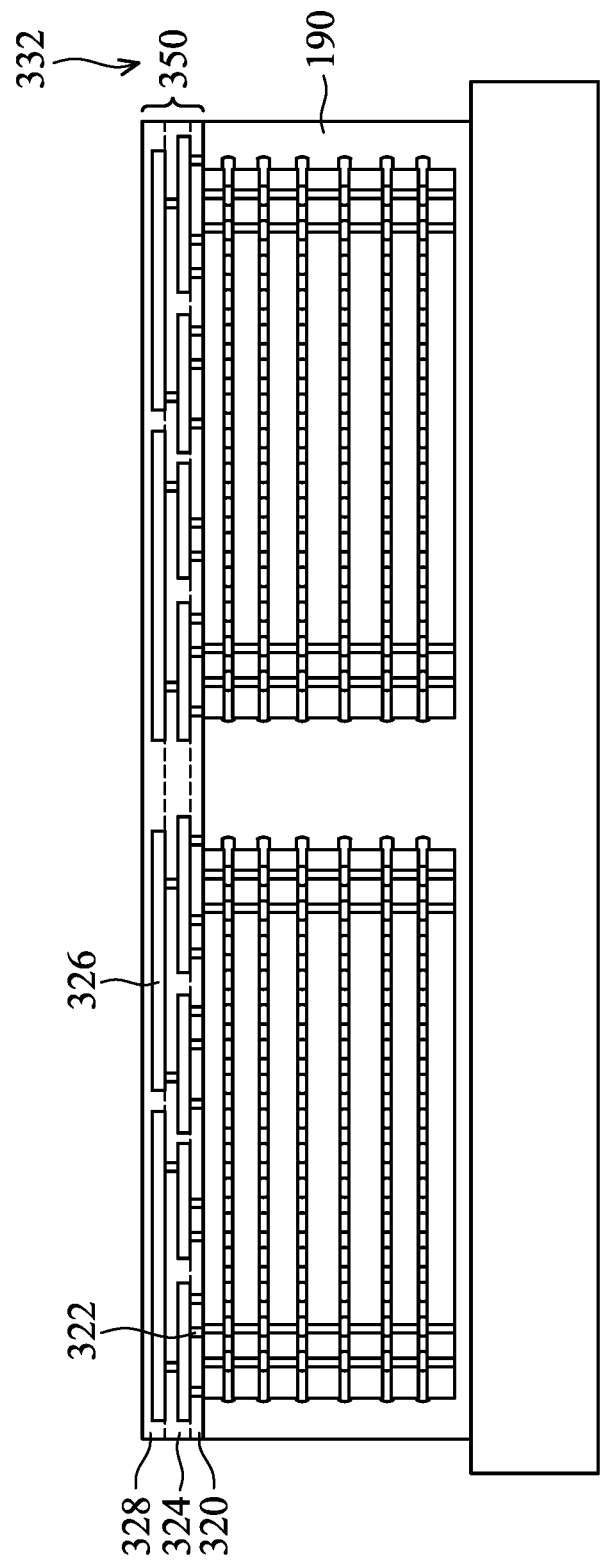

In FIG. 18, a front-side redistribution structure 350 is formed over the encapsulant 190 and stacks of semiconductor devices 100. The front-side redistribution structure 350 includes dielectric layers 320, 324, and 328 and metallization patterns 322 and 326. The metallization patterns may also be referred to as redistribution layers or redistribution lines. The front-side redistribution structure 350 is shown as an example having two layers of metallization patterns. More or fewer dielectric layers and metallization patterns may be formed in the front-side redistribution structure 350. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 350, the dielectric layer 320 can be deposited on the encapsulant 190 and stacks of semiconductor devices 100. In some embodiments, the dielectric layer 320 is formed of a photo-sensitive material such as PBO, polyimide, BCB, or the like, which may be patterned using a lithography mask. The dielectric layer 320 may be formed by spin coating, lamination, CVD, the like, or a combination thereof. The dielectric layer 320 is then patterned. The patterning forms openings exposing portions of through vias 160 and/or contact pads 144. The patterning may be by an acceptable process, such as by exposing the dielectric layer 320 to light when the dielectric layer 320 is a photo-sensitive material or by etching using, for example, an anisotropic etch. If the dielectric layer 320 is a photo-sensitive material, the dielectric layer 320 can be developed after the exposure.

The metallization pattern 322 is then formed. The metallization pattern 322 includes line portions (also referred to as conductive lines) on and extending along the major surface of the dielectric layer 320. The metallization pattern 322 further includes via portions (also referred to as conductive vias) extending through the dielectric layer 320 to be connected to the through vias 160 and/or contact pads 144. As an example to form the metallization pattern 322, a seed layer is formed over the dielectric layer 320 and in the openings extending through the dielectric layer 320. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 322. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 322. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 324 is then deposited on the metallization pattern 322 and dielectric layer 320. The dielectric layer 324 can be formed in a similar manner and of similar materials as the dielectric layer 320.

The metallization pattern 326 is then formed. The metallization pattern 326 includes line portions on and extending along the major surface of the dielectric layer 324. The metallization pattern 326 further includes via portions extending through the dielectric layer 324 to be connected to the metallization pattern 322. The metallization pattern 326 can be formed in a similar manner and of similar materials as the metallization pattern 322. In some embodiments, the metallization pattern 326 has a different size than the metallization pattern 322. For example, the conductive lines and/or vias of the metallization pattern 326 may be wider or thicker than the conductive lines and/or vias of the metallization pattern 322. Further, the metallization pattern 326 may be formed to a greater pitch than the metallization pattern 322.

The dielectric layer 328 is then deposited on the metallization pattern 326 and dielectric layer 324. The dielectric layer 328 can be formed in a similar manner and of similar materials as the dielectric layer 320.

Figure 19:
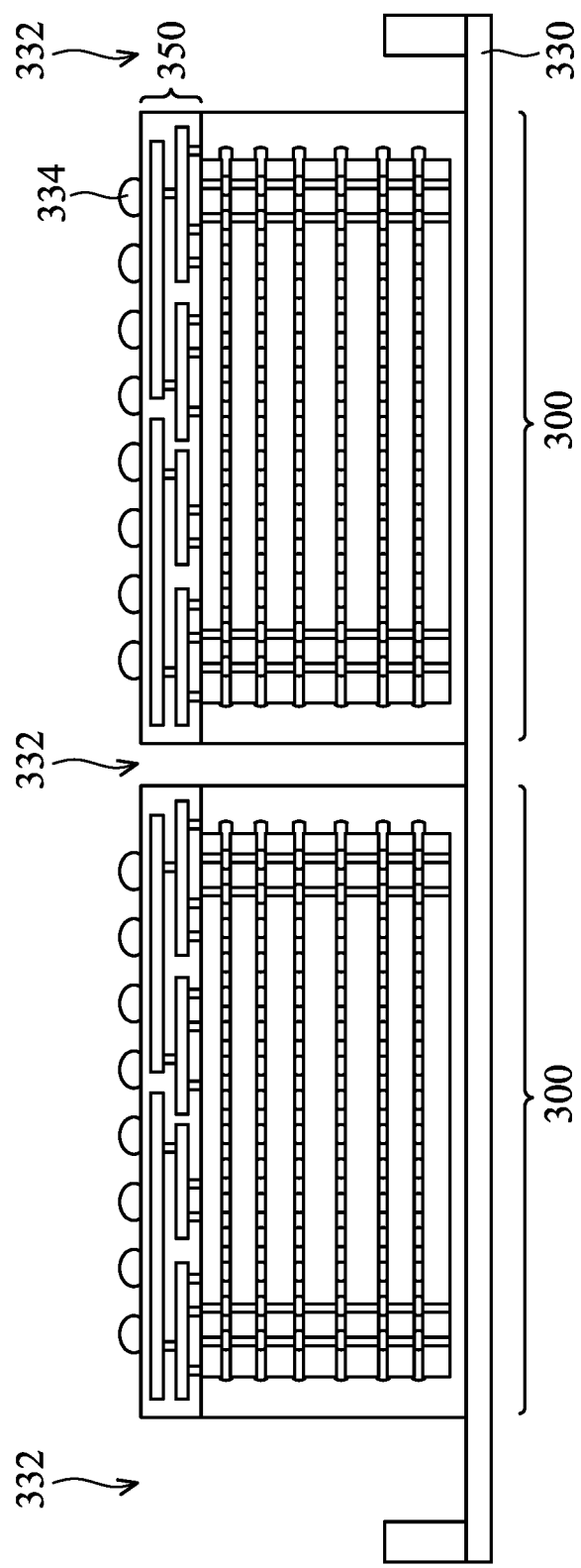

In FIG. 19, a carrier substrate de-bonding is performed to detach (de-bond) the carrier substrate 310 from the semiconductor packages 300. In accordance with some embodiments, the de-bonding includes projecting a light such as a laser light or an UV light on the release layer (if present) so that the release layer decomposes under the heat of the light and the carrier substrate 310 can be removed. The structure is then placed on a tape 330.

A singulation process is performed by sawing along scribe line regions 332, e.g., between the separate stacks of the semiconductor devices 100. The resulting, singulated semiconductor packages 300 are from the separate stacks of the semiconductor devices 100 on the tape 330.

Further in FIG. 19, conductive connectors 334 are formed over and electrically coupled to the redistribution structure 350. The conductive connectors 334 allow for the semiconductor package 300 to be mechanically and electrically coupled to another package structure. UBMs (not shown) may also be formed before the conductive connectors 334 to electrically couple the conductive connectors 334 to the metallization patterns of the redistribution structure 350. These UBMs may be similar to the UBMs 148 described above and the description is not repeated herein. The conductive connectors 334 may be similar to the conductive connectors 150 described above and the description is not repeated herein.

Figure 20:
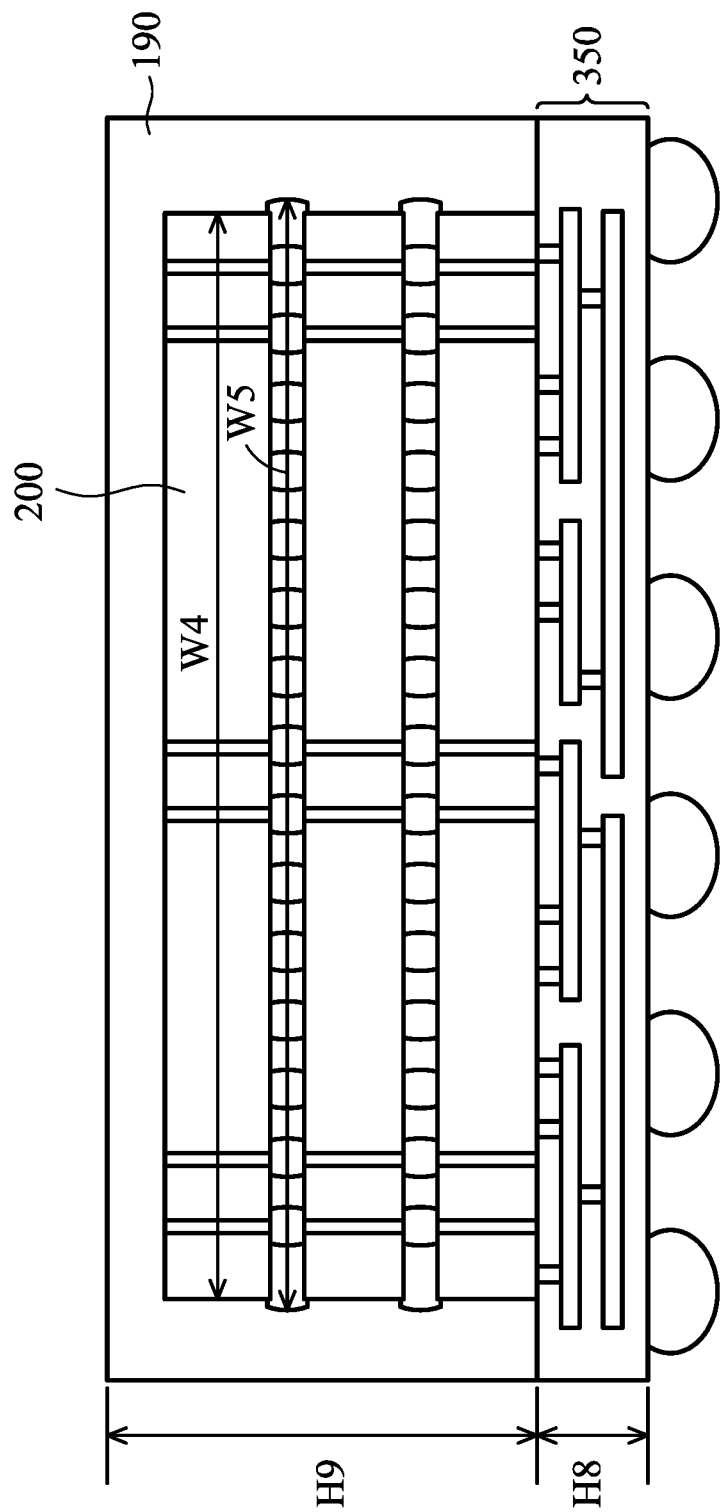

FIG. 20 illustrates a semiconductor package 300 after it has been removed from the tape 330. FIG. 20 also illustrates dimensions of the semiconductor package 300. In FIG. 20, a height of the redistribution structure 350 is shown by H8 and a height of the encapsulant 190 of the semiconductor package 300 is shown by H9. In some embodiments, H9 is greater than H8. In FIG. 20, a width of the semiconductor device 100 from outer sidewall to outer sidewall is shown by W4. Further in FIG. 20, a width of the underfill 172 from outer sidewall to outer sidewall is shown by W5. In some embodiments, W4 is greater than W5. In some embodiments, W5 is greater than W4. In some embodiments W4 is equal to W5.

FIGS. 21-29 illustrate cross-sectional views of intermediate steps during a process for forming a package 700, in accordance with some embodiments. Details regarding this embodiment that are similar to those for the previously described embodiment will not be repeated herein.

Figure 21:
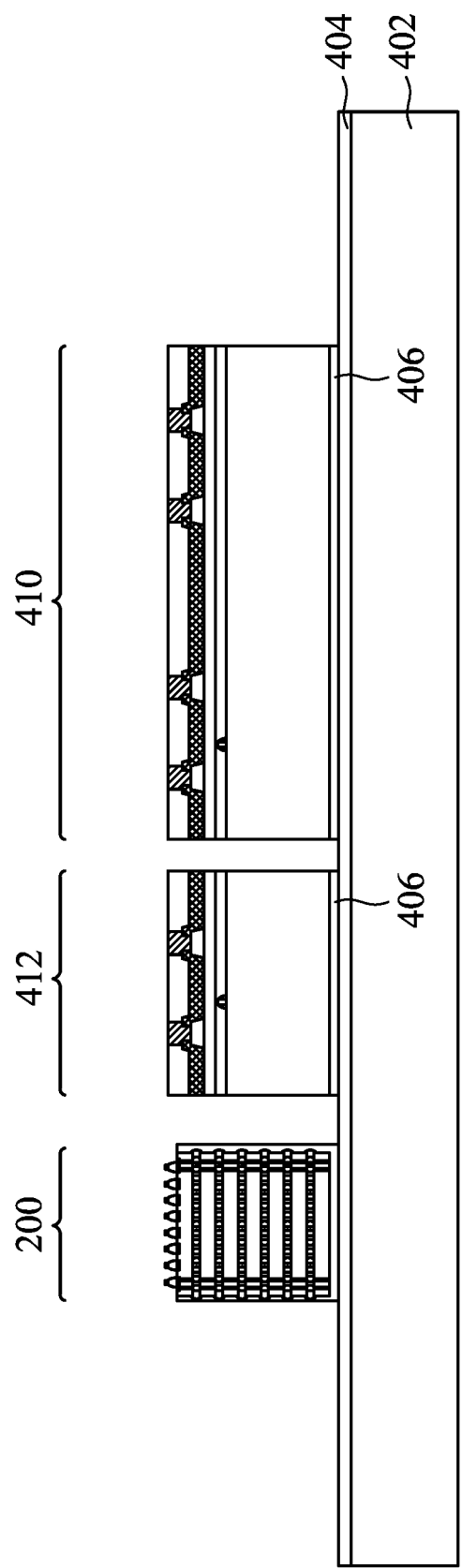
FIGS. 21-29 illustrate cross-sectional views of various intermediate stages of fabrication of a package in accordance with some embodiments.

FIGS. 21-28 illustrate cross-sectional views of intermediate steps during a process for forming a package 400, in accordance with some embodiments. In FIG. 21, a carrier substrate 402 is provided, and a release layer 404 is formed on the carrier substrate 402. The carrier substrate 402 may be a glass carrier substrate, a ceramic carrier substrate, or the like. The carrier substrate 402 may be a wafer, such that multiple packages can be formed on the carrier substrate 402 simultaneously.

The release layer 404 may be formed of a polymer-based material, which may be removed along with the carrier substrate 402 from overlying structures that will be formed in subsequent steps. In some embodiments, the release layer 404 is an epoxy-based thermal-release material, which loses its adhesive property when heated, such as a light-to-heat-conversion (LTHC) release coating. In other embodiments, the release layer 404 may be an ultra-violet (UV) glue, which loses its adhesive property when exposed to UV light. The release layer 404 may be dispensed as a liquid and cured, may be a laminate film laminated onto the carrier substrate 402, or may be the like. A top surface of the release layer 404 may be leveled and may have a high degree of planarity.

In FIG. 21, modules 410 and 412 (sometimes referred to as dies 410 and 412) and the semiconductor package 200 are adhered to the release layer 404 by an adhesive 406. Although two modules 410 and 412 are illustrated as being adhered, it should be appreciated that more or less module 410 and/or 412 may be adhered to the release layer 404. For example, three or four module 410 and/or 412 may be adhered to the release layer 404. In some embodiments, the module 410 and/or 412 are integrated circuit dies and may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. In some embodiments, the module 410 and/or 412 may be passive devices, such as integrated passive devices (IPDs) or discrete passive devices. In some embodiments, the modules 410 and/or 412 may be power supply modules, memory modules, voltage regulator modules, (IPD) modules, the like, or a combination thereof. In an embodiment, the module 410 is a system-on-a-chip (SoC) and the module 412 is a high bandwidth memory module. Also, in some embodiments, the module 410 and/or 412 may be different sizes (e.g., different heights and/or surface areas), and in other embodiments, the module 410 and/or 412 may be the same size (e.g., same heights and/or surface areas). The module 410 and/or 412 are described in greater detail below with respect to FIG. 22.

In some embodiments, a back-side redistribution structure may be formed on the release layer 404 before the modules 410 and 412 and semiconductor package 200 are adhered such that the modules 410 and 412 and semiconductor package 200 are adhered to the back-side redistribution structure. In an embodiment, a back-side redistribution structure includes a one or more dielectric layers with one or more metallization patterns (sometimes referred to as redistribution layers or redistribution lines) within those dielectric layers. In some embodiments, a dielectric layer without metallization patterns is formed on the release layer 404 before the modules 410 and 412 and semiconductor package 200 are adhered to the dielectric layer.

Figure 22:
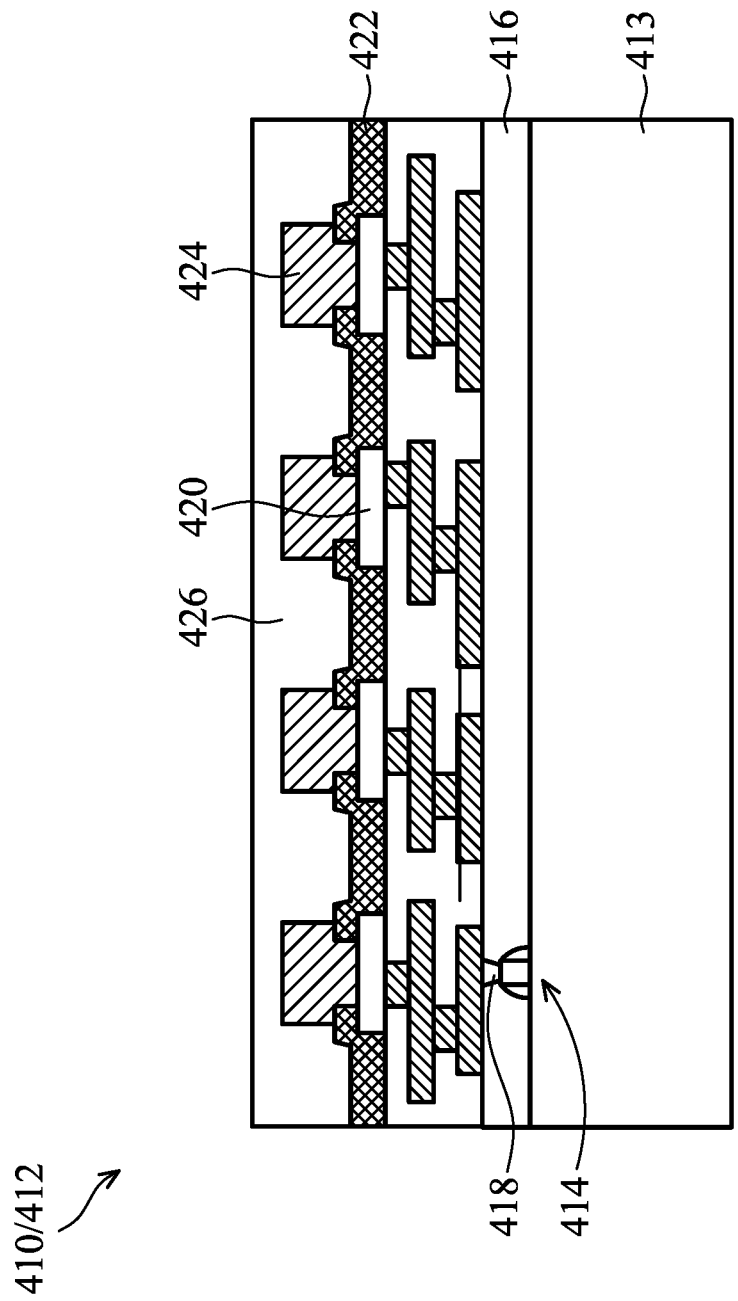

FIG. 22 illustrates one of the modules 410/412 in accordance with some embodiments. The module 410/412 will be packaged in subsequent processing to form an integrated circuit package. The modules 410/412 may be formed in a wafer, which may include different device regions that are singulated in subsequent steps to form a plurality of active device dies. The modules 410/412 may be processed according to applicable manufacturing processes to form integrated circuits. For example, the modules 410/412 includes a semiconductor substrate 413, such as silicon, doped or undoped, or an active layer of a semiconductor-on-insulator (SOI) substrate. The semiconductor substrate 413 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 413 has an active surface (e.g., the surface facing upwards in FIG. 22), sometimes called a front-side, and an inactive surface (e.g., the surface facing downwards in FIG. 22), sometimes called a back-side.

Devices 414 may be formed at the front side of the semiconductor substrate 413. The devices 414 may be active devices (e.g., transistors, diodes, or the like), capacitors, resistors, or the like. An inter-layer dielectric (ILD) 416 is formed over the front side of the semiconductor substrate 413. The ILD 416 surrounds and may cover the devices 414. The ILD 416 may include one or more dielectric layers formed of materials such as phosphosilicate glass (PSG), borosilicate glass (BSG), boron-doped phosphosilicate glass (BPSG), undoped silicate glass (USG), or the like.

Conductive plugs 418 extend through the ILD 416 to electrically and physically couple the devices 414. For example, when the devices 414 are transistors, the conductive plugs 418 may couple the gates and source/drain regions of the transistors. The conductive plugs 418 may be formed of tungsten, cobalt, nickel, copper, silver, gold, aluminum, the like, or combinations thereof. An interconnect structure 419 is included over the ILD 416 and the conductive plugs 418. The interconnect structure 419 interconnects the devices 414 to form an integrated circuit. The interconnect structure 419 may be formed by, for example, metallization patterns in dielectric layers on the ILD 416. The metallization patterns include metal lines and vias formed in one or more low-k dielectric layers. The metallization patterns of the interconnect structure 419 are electrically coupled to the devices 414 by the conductive plugs 418.

The module 410/412 further includes pads 420, such as aluminum pads, to which external connections are made. The pads 420 are on the active side of the module 410/412, such as in and/or on the interconnect structure 419. One or more passivation films 422 are on the module 410/412, such as on portions of the interconnect structure 419 and the pads 420. Openings extend through the passivation films 422 to the pads 420. Die connectors 424, such as conductive pillars (formed of a metal such as copper, for example), extend through the openings in the passivation films 422 and are physically and electrically coupled to respective ones of the pads 420. The die connectors 424 may be formed by, for example, plating, or the like. The die connectors 424 electrically couple the respective integrated circuits of the module 410/412.

Optionally, solder regions (e.g., solder balls or solder bumps) may be disposed on the pads 420. The solder balls may be used to perform chip probe (CP) testing on the module 410/412. The CP testing may be performed on the module 410/412 to ascertain whether the module 410/412 is a known good die (KGD). Thus, only modules 410/412, which are KGDs, undergo subsequent processing are packaged, and dies, which fail the CP testing, are not packaged. After testing, the solder regions may be removed in subsequent processing steps.

A dielectric layer 426 may be on the front side of the module 410/412, such as on the passivation films 422 and the die connectors 424. The dielectric layer 426 laterally encapsulates the die connectors 424, and the dielectric layer 426 is laterally coterminous with the module 410/412. Initially, the dielectric layer 426 may bury the die connectors 424, such that a topmost surface of the dielectric layer 426 is above topmost surfaces of the die connectors 424. In some embodiments where solder regions are disposed on the die connectors 424, the dielectric layer 426 may bury the solder regions as well. Alternatively, the solder regions may be removed prior to forming the dielectric layer 426.

The dielectric layer 426 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 426 may be formed, for example, by spin coating, lamination, chemical vapor deposition (CVD), or the like. In some embodiments, the die connectors 424 are exposed through the dielectric layer 426 during formation of the module 410/412. In some embodiments, the die connectors 424 remain buried and are exposed during a subsequent process for packaging the module 410/412. Exposing the die connectors 424 may remove any solder regions that may be present on the die connectors 424.

In some embodiments, the module 410/412 is a stacked device that includes multiple semiconductor substrates 413. For example, the module 410/412 may be a memory device such as a hybrid memory cube (HMC) module, a high bandwidth memory (HBM) module, or the like that includes multiple memory dies. In such embodiments, the module 410/412 includes multiple semiconductor substrates 413 interconnected by through-substrate vias (TSVs). Each of the semiconductor substrates 413 may have an interconnect structure 419.

The adhesive 406 is on back sides of the modules 410/412 and semiconductor package 200 and adheres the modules 410/412 and semiconductor package 200 to release layer 404. The adhesive 406 may be any suitable adhesive, epoxy, die attach film (DAF), or the like. The adhesive 406 may be applied to a back side of the modules 410/412 and semiconductor package 200, such as to a back side of the respective semiconductor wafer or may be applied over the surface of the carrier substrate 402. The modules 410/412 may be singulated, such as by sawing or dicing, and adhered to the release layer 404 by the adhesive 406 using, for example, a pick-and-place tool.

Figure 23:
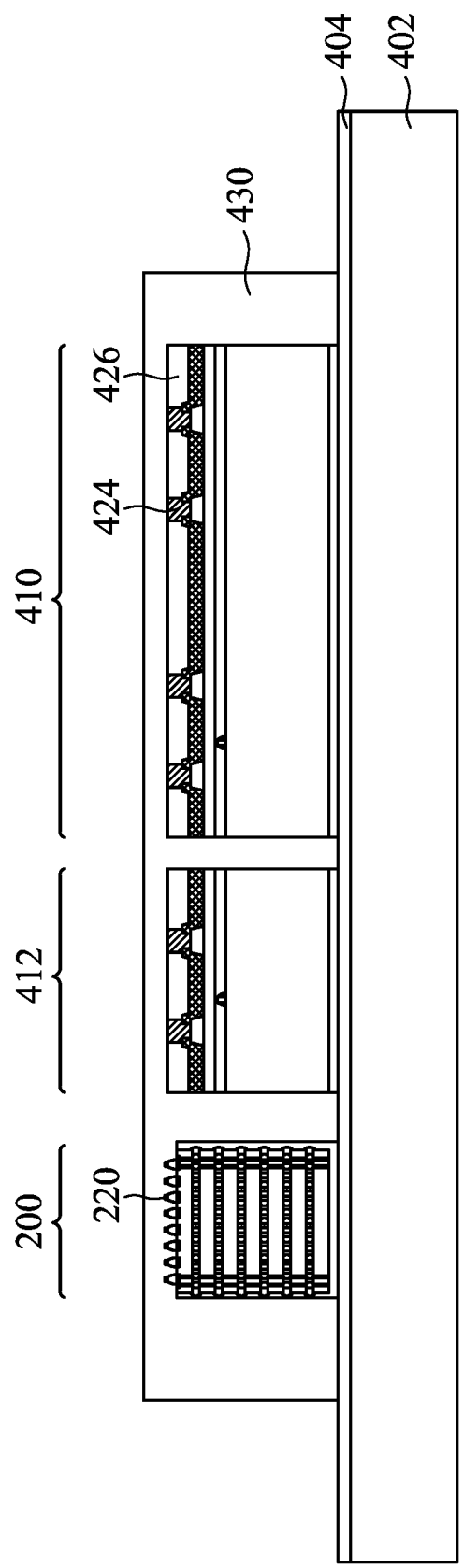

In FIG. 23, an encapsulant 430 is formed on and around the modules 410/412 and semiconductor package 200. After formation, the encapsulant 430 encapsulates the modules 410/412 and semiconductor package 200. The encapsulant 430 may be a molding compound, epoxy, or the like. The encapsulant 430 may be applied by compression molding, transfer molding, or the like, and may be formed over the carrier substrate 402 such that the modules 410/412 and semiconductor package 200 are buried or covered. The encapsulant 430 is further formed in gap regions between the modules 410/412 and semiconductor package 200. The encapsulant 430 may be applied in liquid or semi-liquid form and subsequently cured.

Figure 24:
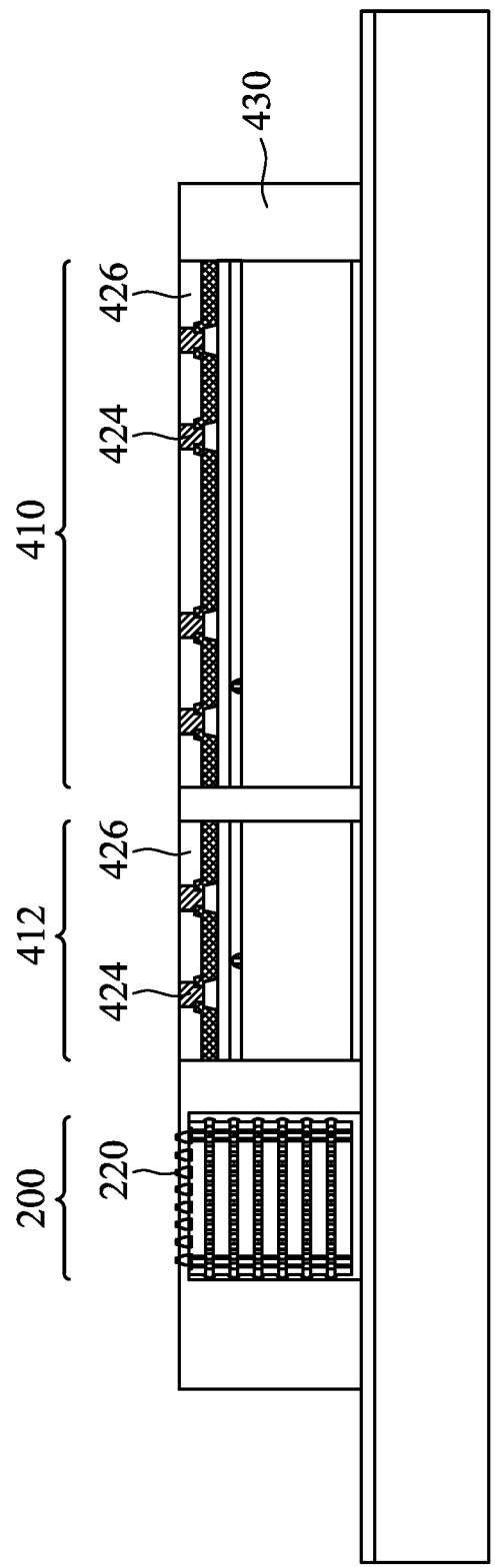

In FIG. 24, a planarization process is performed on the encapsulant 430 to expose the die connectors 424, conductive connectors 220, and dielectric layers 426. The planarization process may also remove material of the dielectric layers 426, conductive connectors 220, and/or the die connectors 424 until the conductive connectors 220 and die connectors 424 are exposed. Following the planarization process, top surfaces of the, the conductive connectors 220, the die connectors 424, the dielectric layers 426, and the encapsulant 430 may be level with one another (e.g., coplanar). The planarization process may be, for example, a chemical-mechanical polish (CMP) process, a grinding process, an etch-back process, or the like. In some embodiments, the planarization process may be omitted, for example, if the die connectors 424 and the conductive connectors 220 are already exposed.

Figure 25:
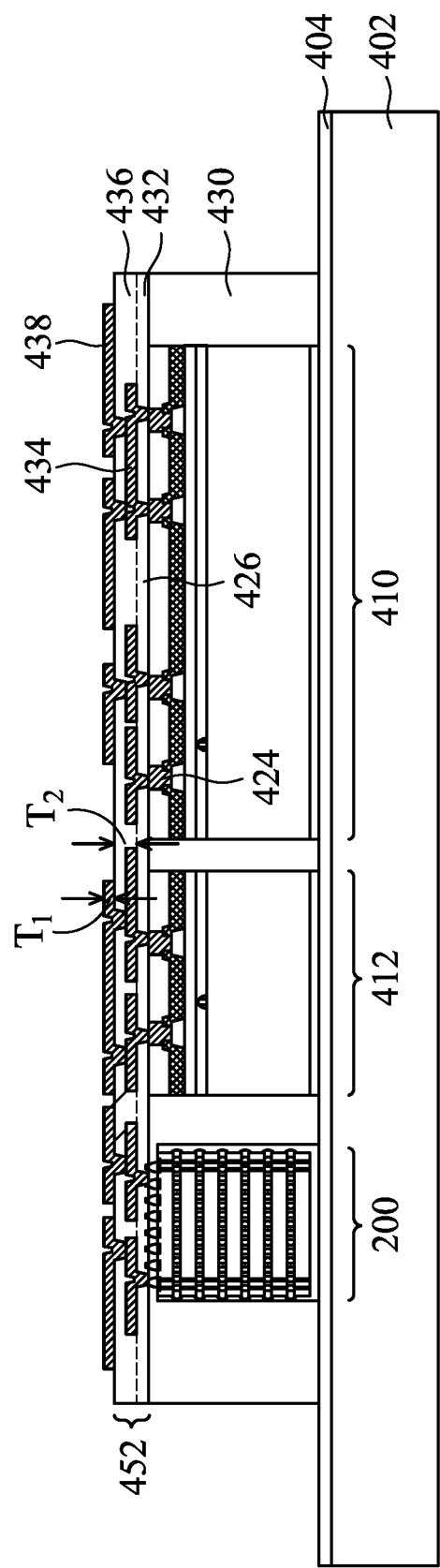
Figure 26:
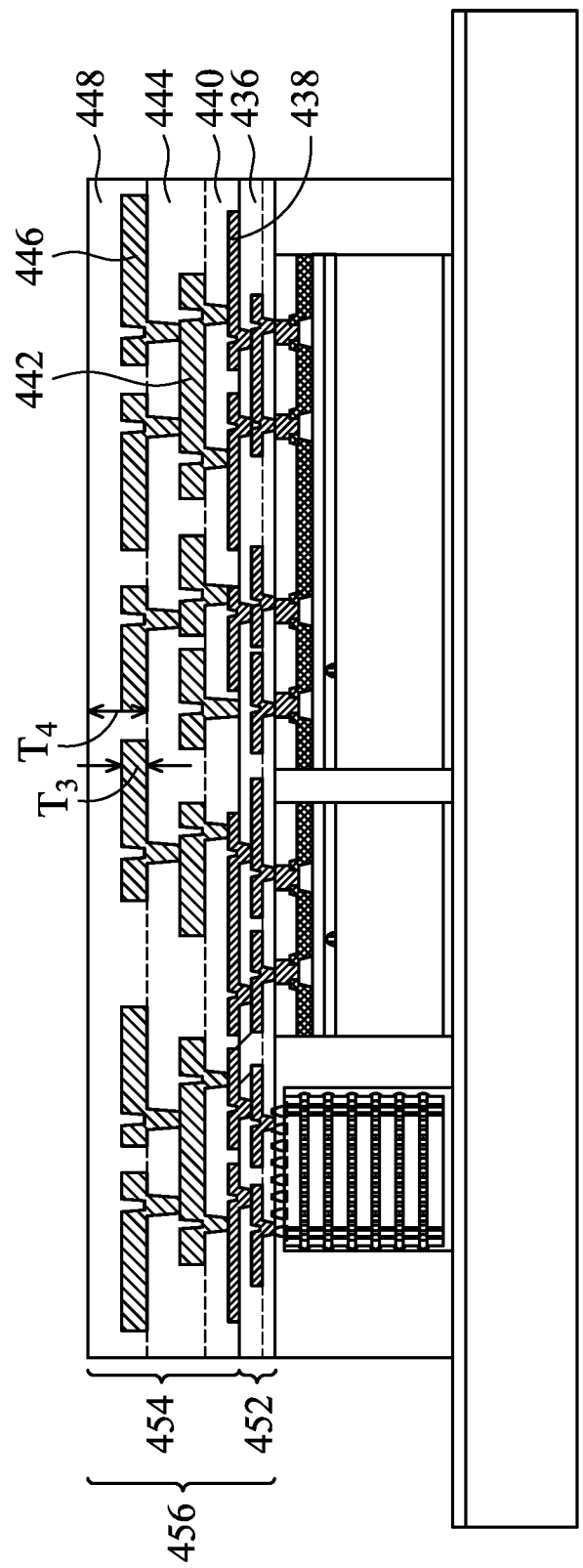
Figure 27:
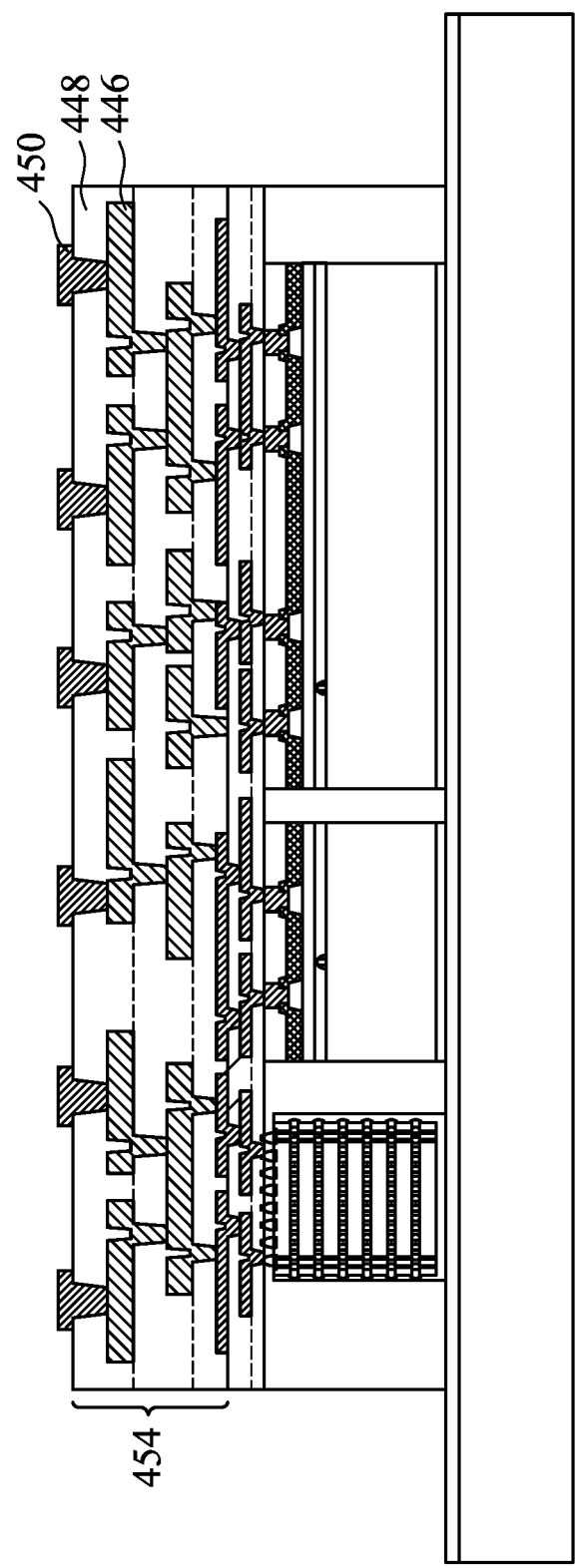

In FIGS. 25 through 27, a redistribution structure 456 (see FIG. 27) having a fine-featured portion 452 and a coarse-featured portion 454 is formed over the encapsulant 430 and the modules 410/412 and semiconductor package 200. The redistribution structure 456 includes metallization patterns, dielectric layers, and underbump metallurgies (UBMs). The metallization patterns may also be referred to as redistribution layers or redistribution lines. The redistribution structure 456 is shown as an example having four layers of metallization patterns. More or fewer dielectric layers and metallization patterns may be formed in the redistribution structure 456. If fewer dielectric layers and metallization patterns are to be formed, steps and process discussed below may be omitted. If more dielectric layers and metallization patterns are to be formed, steps and processes discussed below may be repeated. The fine-featured portion 452 and the coarse-featured portion 454 of the redistribution structure 456 include metallization patterns and dielectric layers of differing sizes.

FIG. 25 illustrates an example of forming the fine-featured portion 452 of the redistribution structure 456. In FIG. 25, the dielectric layer 432 is deposited on the encapsulant 430, the dielectric layers 426, the conductive connectors 220, and the die connectors 424. In some embodiments, the dielectric layer 432 is formed of a photo-sensitive material such as PBO, polyimide, BCB, or the like, which may be patterned using a lithography mask. The dielectric layer 432 may be formed by spin coating, lamination, CVD, the like, or a combination thereof.

The dielectric layer 432 is then patterned and metallization pattern 434 is formed. The patterning forms openings exposing portions of the conductive connectors 220 and the die connectors 424. The patterning may be by an acceptable process, such as by exposing the dielectric layer 432 to light when the dielectric layer 432 is a photo-sensitive material or by etching using, for example, an anisotropic etch. If the dielectric layer 432 is a photo-sensitive material, the dielectric layer 432 can be developed after the exposure.

The metallization pattern 434 is then formed. The metallization pattern 434 has line portions (also referred to as conductive lines or traces) on and extending along the major surface of the dielectric layer 432, and has via portions (also referred to as conductive vias) extending through the dielectric layer 432 to physically and electrically couple the die connectors 424 of the modules 410/412 and the conductive connectors 220 of the semiconductor package 200. As an example, the metallization pattern 434 may be formed by forming a seed layer over the dielectric layer 432 and in the openings extending through the dielectric layer 432. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 434. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the metallization pattern 434. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

The dielectric layer 436 is then deposited on the metallization pattern 434 and the dielectric layer 432. The dielectric layer 436 may be formed in a manner similar to the dielectric layer 432, and may be formed of a material similar to the material of the dielectric layer 432.

The dielectric layer 436 is then patterned and the metallization pattern 438 is formed. The patterning forms openings exposing portions of the metallization pattern 434. The patterning may be by an acceptable process, such as by exposing the dielectric layer 436 to light when the dielectric layer 436 is a photo-sensitive material or by etching using, for example, an anisotropic etch. If the dielectric layer 436 is a photo-sensitive material, the dielectric layer 436 can be developed after the exposure.

The metallization pattern 438 is then formed. The metallization pattern 438 has line portions on and extending along the major surface of the dielectric layer 436, and has via portions extending through the dielectric layer 436 to physically and electrically couple the metallization pattern 434. The metallization pattern 438 may be formed in a manner similar to the metallization pattern 434, and may be formed of a material similar to the material of the metallization pattern 434. Although the fine-featured portion 452 is illustrated as including two dielectric layers and two metallization patterns, any number of dielectric layers and metallization patterns may be formed in the fine-featured portion 452.

The fine-featured portion 452 of the redistribution structure 456 includes dielectric layers 432 and 436; and metallization patterns 434 and 438. In some embodiments, the dielectric layers 432 and 436 are formed from a same dielectric material, and are formed to a same thickness. Likewise, in some embodiments, the conductive features of the metallization patterns 434 and 438 are formed from a same conductive material, and are formed to a same thickness. In particular, the dielectric layers 432 and 436 have a thickness T2, such as in the range of about 1 μm to about 40 μm, and the conductive features of the metallization patterns 434 and 438 have a thickness T1, such as in the range of about 1 μm to about 40 μm.

FIG. 26 illustrates an example of forming the coarse-featured portion 454 of the redistribution structure 456. In FIG. 26, a dielectric layer 440 may be deposited on the metallization pattern 438 and the dielectric layer 436. The dielectric layer 440 may be formed in a manner similar to the dielectric layer 432, and may be formed of a material similar to the material of the dielectric layer 432.

The dielectric layer 440 may be patterned and a metallization pattern 442 is then formed. The metallization pattern 442 has line portions on and extending along the major surface of the dielectric layer 440, and has via portions extending through the dielectric layer 440 to physically and electrically couple the metallization pattern 438. The metallization pattern 442 may be formed in a manner similar to the metallization pattern 434, and may be formed of a material similar to the material of the metallization pattern 434.

A dielectric layer 444 is then deposited on the metallization pattern 442 and the dielectric layer 440. The dielectric layer 444 may be formed in a manner similar to the dielectric layer 432, and may be formed of a material similar to the material of the dielectric layer 432.

In FIG. 12, the dielectric layer 444 is patterned and a metallization pattern 446 is then formed. The dielectric layer 444 may be patterned in a manner similar to the dielectric layer 432. The metallization pattern 446 has line portions on and extending along the major surface of the dielectric layer 444, and has via portions extending through the dielectric layer 444 to physically and electrically couple the metallization pattern 442. The metallization pattern 446 may be formed in a manner similar to the metallization pattern 434, and may be formed of a material similar to the material of the metallization pattern 434.

A dielectric layer 448 is then deposited on the metallization pattern 446 and the dielectric layer 444. The dielectric layer 448 may be formed in a manner similar to the dielectric layer 432, and may be formed of a material similar to the material of the dielectric layer 432. Although the coarse-featured portion 454 is illustrated as including three dielectric layers and two metallization patterns, any number of dielectric layers and metallization patterns may be formed in the coarse-featured portion 454. In some embodiments, the fine-featured portion 452 and the coarse-featured portion 454 may each include 3 dielectric layers and 3 metallization patterns.

The coarse-featured portion 454 of the redistribution structure 456 includes dielectric layers 440, 444, and 448; and metallization patterns 442 and 446. In some embodiments, the dielectric layers 440, 444, and 448 are formed from a same dielectric material, and are formed to a same thickness. Likewise, in some embodiments, the conductive features of the metallization patterns 442 and 446 are formed from a same conductive material, and are formed to a same thickness. In particular, the dielectric layers 440, 444, and 448 have a thickness T4, such as in the range of about 1 μm to about 40 μm, and the conductive features of the metallization patterns 442 and 446 have a thickness T3, such as in the range of about 1 μm to about 40 μm. In various embodiments, the thickness T3 may be greater than the thickness T1 (see FIG. 25), and the thickness T4 may be greater than the thickness T2 (see FIG. 25).

The coarse-featured portion 454 may have lower resistance compared to the fine-featured portion 452 due to the thickness of the metallization patterns included in the coarse-featured portion 454 and the fine-featured portion 452. The coarse-featured portion 454 may be used to route power lines due to the lower resistance. The fine-featured portion 452 may be used to route signal lines, which do not require the lower resistance. Including both the coarse-featured portion 454 and the fine-featured portion 452 allows for power lines and signal lines to be routed, while minimizing the thickness of the redistribution structure 456.

In FIG. 27, pads 450 are formed on dielectric layer 448 and in the openings of the dielectric layer 448 to the metallization pattern 446. The pads 450 are used to couple to conductive connectors 458 and may be referred to as under bump metallurgies (UBMs) 450. The UBMs 450 are formed for external connection to the redistribution structure 456. The UBMs 450 have bump portions on and extending along the major surface of the dielectric layer 448, and have via portions extending through the dielectric layer 448 to physically and electrically couple the metallization pattern 446. As a result, the UBMs 450 are electrically coupled to the modules 410/412 and semiconductor package 200. In some embodiments, the UBMs 450 have a different size than the metallization pattern 434, 438, 442, and 446.

As an example, the UBMs 450 may be formed by first forming a seed layer over the dielectric layer 448 and in the openings extending through the dielectric layer 448. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 450. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. In some embodiments, the UBMs 450 may comprise alloys such as electroless nickel, electroless palladium, immersion gold (ENEPIG), electroless nickel, immersion gold (ENIG), or the like. The combination of the conductive material and underlying portions of the seed layer form the UBMs 450. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Figure 28:
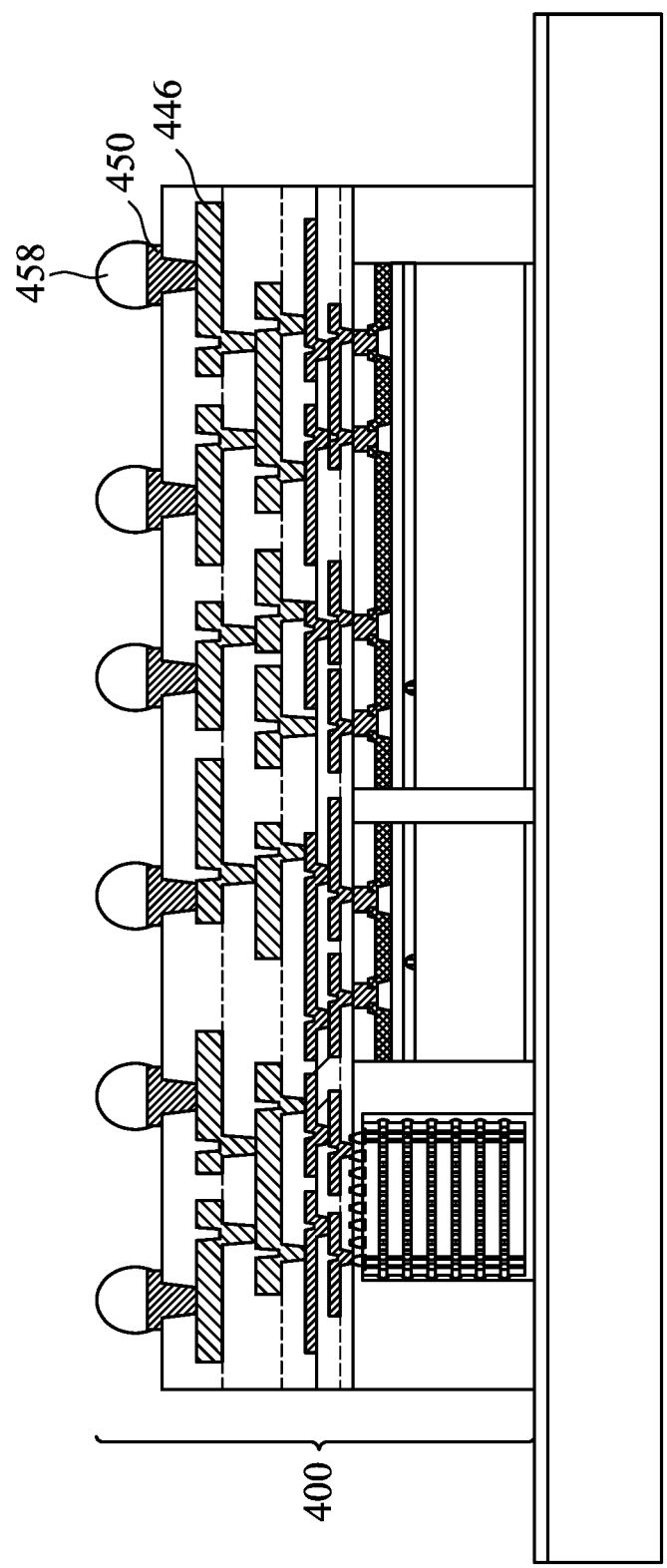

In FIG. 28, conductive connectors 458 are formed on the pads 450. The conductive connectors 458 allow for the semiconductor package 400 to be mechanically and electrically coupled to another package structure (see e.g., substrate 500 in FIG. 29). The conductive connectors 458 may be similar to the conductive connectors 150 described above and the description is not repeated herein.

Figure 29:
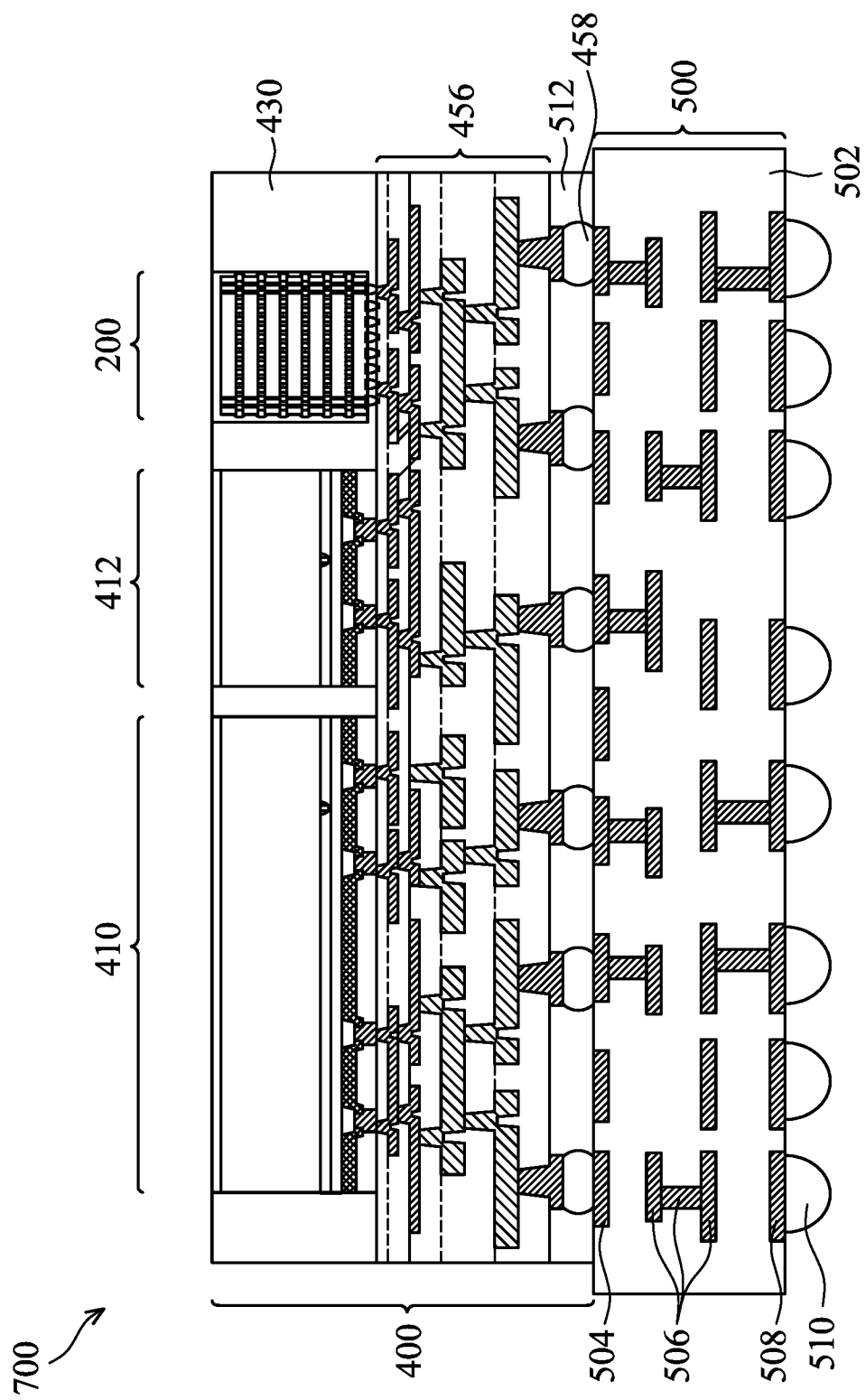

In FIG. 29, the semiconductor package 400 is then attached to a package substrate 500 using the conductive connectors 458 to form the package 700. The package substrate 500 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 500 may be a SOI substrate. Generally, an SOI substrate includes a layer of a semiconductor material such as epitaxial silicon, germanium, silicon germanium, SOI, SGOI, or combinations thereof. The package substrate 500 is, in another embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 500.

The package substrate 500 may include active and passive devices (not illustrated). Devices such as transistors, capacitors, resistors, combinations of these, and the like may be used to generate the structural and functional requirements of the design for the system. The devices may be formed using any suitable methods.

The package substrate 500 may also include metallization layers and vias 506 and bond pads 504 and 508 coupled to the metallization layers and vias 506. The metallization layers 506 may be formed over the active and passive devices and are designed to connect the various devices to form functional circuitry. The metallization layers 506 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 500 is substantially free of active and passive devices.

The conductive connectors 458 are reflowed to attach the UBMs 450 to the bond pads 504. The conductive connectors 458 connect the package substrate 500, including metallization layers 506 in the package substrate 500, to the semiconductor package 400, including metallization patterns of the redistribution structure 456. In some embodiments, surface mount passive devices (e.g., SMDs), not illustrated) may be attached to the package substrate 500, e.g., to the bond pads 504 and/or 508.

The conductive connectors 458 may have an epoxy flux (not illustrated) formed thereon before they are reflowed with at least some of the epoxy portion of the epoxy flux remaining after the semiconductor package 400 is attached to the package substrate 500. This remaining epoxy portion may act as an underfill to reduce stress and protect the joints resulting from the reflowing the conductive connectors 458. In some embodiments, an underfill 512 may be formed between the semiconductor package 400 and the package substrate 500, surrounding the conductive connectors 458. The underfill 512 may be formed by a capillary flow process after the semiconductor package 400 is attached or may be formed by a suitable deposition method before the semiconductor package 400 is attached.

Also, as shown in FIG. 29, the bond pads 508 of the package substrate 500 may have conductive connectors 510 formed on them. These conductive connectors 510 allow for the package 700 to be mechanically and electrically coupled to another package structure. The conductive connectors 510 may be similar to the conductive connectors 150 described above and the description is not repeated herein.

Although the embodiments were illustrated with deep trench capacitors, the disclosure is not so limited. In some embodiments, the semiconductor devices include other types of capacitors such as metal-oxide-metal (MOM) capacitors, metal-insulator-metal (MIM) capacitors, the like, or a combination thereof.

Embodiments may achieve advantages. Embodiments include a semiconductor device which may be an integrated passive devices (IPD) comprising capacitors, such as deep trench capacitors (DTCs), metal-oxide-metal (MOM) capacitors, metal-insulator-metal (MIM) capacitors, the like, or a combination thereof. The semiconductor devices are vertically stacked and connected to effectively form a larger semiconductor device. By having vertically stacked IPDs, a high-efficiency capacitor—that may be used as a decoupling capacitor—can be formed. Also, the package structure including the one or more capacitors that are vertically stacked and coupled can provide a lower equivalent series resistance (ESR) of the capacitors. In some examples, these semiconductor devices may be incorporated into package structures (e.g., an integrated fan-out (InFO) package structure or a chip-on-wafer-on-substrate (CoWoS) package structure) to provide a capacitor with a large capacitance value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching a first semiconductor device to a first carrier substrate, the first semiconductor device comprising a first plurality of capacitors in a first substrate and a first through via extending through the first substrate, the first through via being electrically coupled to the first plurality of capacitors;
    bonding a second semiconductor device to the first semiconductor device with a first set of conductive connectors, the second semiconductor device comprising a second plurality of capacitors formed in a second substrate and a second through via extending through the second substrate, the second through via being electrically coupled to the second plurality of capacitors and the first set of conductive connectors, at least one of the first set of conductive connectors electrically coupling the first through via and the second through via;
    encapsulating the first and second semiconductor devices with a first encapsulant;
    removing the first carrier substrate; and
    forming a second set of conductive connectors on the first semiconductor device, the second set of conductive connectors being electrically coupled to the first semiconductor device, the second set of conductive connectors being on an opposite side of the first semiconductor device as the first set of conductive connectors.

2. The method of claim 1 further comprising:
    forming a first redistribution structure on the first encapsulant and the first semiconductor device, the first redistribution structure comprising a plurality of dielectric layers with metallization patterns therein, the first redistribution structure being between the first semiconductor device and the second set of conductive connectors, the metallization patterns of the first redistribution structure being electrically coupled to the first through via and the second set of conductive connectors.

3. The method of claim 1 further comprising:
    bonding a third semiconductor device to the second semiconductor device with a third set of conductive connectors, the third semiconductor device comprising a third plurality of capacitors formed in a third substrate and a third through via extending through the third substrate, the third through via being electrically coupled to the third plurality of capacitors and the third set of conductive connectors, at least one of the third set of conductive connectors electrically coupling the second through via and the third through via; and
    bonding a fourth semiconductor device to the third semiconductor device with a fourth set of conductive connectors, the fourth semiconductor device comprising a fourth plurality of capacitors formed in a fourth substrate and a fourth through via extending through the fourth substrate, the fourth through via being electrically coupled to the fourth plurality of capacitors and the fourth set of conductive connectors, at least one of the fourth set of conductive connectors electrically coupling the third through via and the fourth through via.

4. The method of claim 1 further comprising:
    attaching the first and second semiconductor devices to a second carrier substrate;
    attaching a first integrated circuit structure to the second carrier substrate, the first integrated circuit structure comprising a first integrated circuit die, the first integrated circuit die comprising active devices;
    encapsulating a the first integrated circuit structure, the first encapsulant, and the second set of conductive connectors with a second encapsulant; and
    forming a second redistribution structure on the second encapsulant, the first integrated circuit structure, and the first semiconductor device, the second redistribution structure comprising a plurality of dielectric layers with metallization patterns therein, the metallization patterns of the second redistribution structure being electrically coupled to the first integrated circuit die and the second set of conductive connectors.

5. The method of claim 4 further comprising:
    forming a fifth set of conductive connectors on the second redistribution structure; and
    bonding the second redistribution structure to a package substrate using the fifth set of conductive connectors.

6. The method of claim 1, wherein the first plurality of capacitors is electrically coupled together in parallel.

7. The method of claim 1, wherein the first plurality of capacitors is a plurality of deep trench capacitors.

8. The method of claim 1, wherein the first through via is mechanically and electrically coupled to the at least one of the first set of conductive connectors and at least one of the second set of conductive connectors.

9. A method comprising:
attaching a first passive package to a carrier substrate, the first passive package comprising a stack of passive dies, each of the passive dies comprising a plurality of passive devices on a substrate and a through via extending through the substrate;
attaching a first integrated circuit package to the carrier substrate, the first integrated circuit package comprising at least one integrated circuit die, the at least one integrated circuit die comprising a plurality of active devices;
encapsulating the first passive package and the first integrated circuit package with a first encapsulant; and
forming a first redistribution structure on the first encapsulant, the first integrated circuit package, and the first passive package, the first redistribution structure comprising a plurality of dielectric layers with metallization patterns therein, the metallization patterns of the first redistribution structure being electrically coupled to the first integrated circuit package and the first passive package.

10. The method of claim 9 further comprising:
attaching a second integrated circuit package to the carrier substrate, the second integrated circuit package comprising at least one integrated circuit die, the at least one integrated circuit die comprising a plurality of active devices, the second integrated circuit package being adjacent the first integrated circuit package.

11. The method of claim 9, wherein the plurality of passive devices in each of the passive dies is electrically coupled together in parallel.

12. The method of claim 9, wherein the plurality of passive devices is a plurality of deep trench capacitors.

13. The method of claim 9 further comprising:
forming a first set of conductive connectors on the first redistribution structure; and
bonding the first redistribution structure to a package substrate using the first set of conductive connectors.

14. A structure comprising:
a first semiconductor device comprising:
a first plurality of passive devices formed on a first substrate; and
a first through via extending through the first substrate, the first through via being electrically coupled to the first plurality of passive devices;
a second semiconductor device comprising:
a second plurality of passive devices formed on a second substrate; and
a second through via extending through the second substrate, the second through via being electrically coupled to the second plurality of passive devices;
a first set of conductive connectors electrically bonding the first semiconductor device and the second semiconductor device, at least one of the first set of conductive connectors electrically coupling the first through via and the second through via; and
a second set of conductive connectors electrically coupled to the first semiconductor device, the second set of conductive connectors being on an opposite side of the first semiconductor device as the first set of conductive connectors.

15. The structure of claim 14, wherein the first plurality of passive devices is electrically coupled together in parallel.

16. The structure of claim 14, wherein the first plurality of passive devices and the second plurality of passive devices are electrically coupled together in parallel.

17. The structure of claim 14, wherein the first plurality of passive devices is a first plurality of capacitors.

18. The structure of claim 14 further comprising:
a first underfill between the first and second semiconductor devices and surrounding the first set of conductive connectors; and
a first encapsulant on at least sidewalls of the first and second semiconductor devices and the first underfill.

19. The structure of claim 18 further comprising:
a first redistribution structure on the first encapsulant and the first semiconductor device, the first redistribution structure comprising a plurality of dielectric layers with metallization patterns therein, the metallization patterns of the first redistribution structure being electrically coupled to the first through via and the second set of conductive connectors.

20. The structure of claim 14 further comprising:
a third semiconductor device comprising:
a third plurality of passive devices formed on a third substrate; and
a third through via extending through the third substrate, the third through via being electrically coupled to the third plurality of passive devices and the second through via;
a fourth semiconductor device comprising:
a fourth plurality of passive devices formed on a fourth substrate; and
a fourth through via extending through the fourth substrate, the fourth through via being electrically coupled to the fourth plurality of passive devices and the third through via; and
wherein the third and fourth semiconductor devices are on an opposite side of the second semiconductor device as the first semiconductor device.

* * * * *